(12) United States Patent
Chu et al.

(10) Patent No.: US 7,968,379 B2
(45) Date of Patent: Jun. 28, 2011

(54) METHOD OF SEPARATING SEMICONDUCTOR DIES

(75) Inventors: Chen-Fu Chu, Hsinchu (TW); Trung Tri Doan, Baoshan Township (TW); Hao-Chun Cheng, Donggang Township, Pingtung County (TW); Feng-Hsu Fan, Jhonghe (TW); Fu-Hsien Wang, Sinpu Township, Hsinchu County (TW)

(73) Assignee: SemiLEDs Optoelectronics Co., Ltd., Chu-Nan (TW)

( * ) Notice: Subject to any disclaimer, the term of this patent is extended or adjusted under 35 U.S.C. 154(b) by 45 days.

(21) Appl. No.: 12/273,331

(22) Filed: Nov. 18, 2008

(65) Prior Publication Data

US 2009/0093075 A1    Apr. 9, 2009

Related U.S. Application Data

(63) Continuation-in-part of application No. 11/682,814, filed on Mar. 6, 2007, now Pat. No. 7,452,739.

(60) Provisional application No. 60/780,896, filed on Mar. 9, 2006.

(51) Int. Cl.
*H01L 21/301* (2006.01)

(52) U.S. Cl. . 438/113; 438/464; 438/462; 257/E21.175; 257/E21.479; 257/E21.238

(58) Field of Classification Search ............ 438/33, 438/113, 464, 462, 977; 257/E21.175, E21.479, 257/E21.238; 148/DIG. 12
See application file for complete search history.

(56) References Cited

U.S. PATENT DOCUMENTS

| | | | |
|---|---|---|---|
| 3,913,217 A | 10/1975 | Misawa et al. | |
| 4,640,739 A | 2/1987 | Modic et al. | |
| 5,300,788 A | 4/1994 | Fan et al. | |
| 5,453,405 A | 9/1995 | Fan et al. | |
| 5,882,986 A | 3/1999 | Eng et al. | |
| 6,391,658 B1 * | 5/2002 | Gates et al. | 438/3 |
| 6,403,985 B1 | 6/2002 | Fan et al. | |
| 6,458,619 B1 | 10/2002 | Irissou | |
| 6,607,941 B2 | 8/2003 | Prabhu et al. | |
| 6,787,866 B2 | 9/2004 | Fujii et al. | |
| 6,846,692 B2 | 1/2005 | Silverbrook | |
| 7,413,925 B2 | 8/2008 | Egawa | |
| 2003/0020084 A1 | 1/2003 | Fan et al. | |
| 2005/0167798 A1 | 8/2005 | Doan | |

(Continued)

OTHER PUBLICATIONS

PCT International Search Report and Written Opinion dated Oct. 17, 2007.

*Primary Examiner* — George Fourson
(74) *Attorney, Agent, or Firm* — Patterson & Sheridan, L.L.P.

(57) ABSTRACT

A method for the separation of multiple dies during semiconductor fabrication is described. On an upper surface of a semiconductor wafer containing multiple dies, metal layers are deposited everywhere except where a block of stop electroplating material exists. The stop electroplating material is obliterated, and a barrier layer is formed above the entire remaining structure. A sacrificial metal element is added above the barrier layer, and then the substrate is removed. After the semiconductor material between the individual dies is eradicated, any desired bonding pads and patterned circuitry are added to the semiconductor surface opposite the sacrificial metal element, a passivation layer is added to this surface, and then the sacrificial metal element is removed. Tape is added to the now exposed barrier layer, the passivation layer is removed, the resulting structure is flipped over, and the tape is expanded to separate the individual dies.

51 Claims, 35 Drawing Sheets

U.S. PATENT DOCUMENTS

| | | |
|---|---|---|
| 2005/0248352 A1 | 12/2005 | Fuchs et al. |
| 2005/0269700 A1 | 12/2005 | Farnworth et al. |
| 2006/0151801 A1* | 7/2006 | Doan et al. .................. 257/99 |
| 2006/0154393 A1* | 7/2006 | Doan et al. .................. 438/26 |
| 2007/0017438 A1* | 1/2007 | Xie et al. .................. 117/95 |
| 2007/0284681 A1 | 12/2007 | Massieu et al. |

\* cited by examiner

METHOD OF SEPARATING SEMICONDUCTOR DIES

CROSS-REFERENCE TO RELATED APPLICATIONS

This application is a continuation-in-part of U.S. patent application Ser. No. 11/682,814 filed Mar. 6, 2007, now U.S. Pat. No. 7,452,739 which claims benefit of U.S. Provisional Patent Application Ser. No. 60/780,896 filed Mar. 9, 2006, which are both herein incorporated by reference.

BACKGROUND OF THE INVENTION

1. Field of the Invention

Embodiments of the present invention generally relate to a method of semiconductor fabrication and, more particularly, to a method of separating multiple semiconductor dies.

2. Description of the Related Art

A wide variety of electronic devices, ranging from microprocessors to light-emitting diode (LED) structures, are typically formed in relatively large numbers as die on semiconductor wafer substrates. After formation, the devices must be separated for final packaging, typically via mechanical saw, "scribing and break," or laser.

In many cases, the devices must be placed on some type of device for final assembly, such as a tape allowing manipulation of the devices by a machine, such as a robot used in automated assembly. Due to the delicate nature of the unpackaged devices, handling the devices in preparation of separation or during the separation process presents a challenge.

Accordingly, what is needed is a process to efficiently separate dies.

SUMMARY OF THE INVENTION

One embodiment of the present invention is a method of fabricating a plurality of semiconductor dies. The method generally includes forming one or more semiconductor layers on a substrate; defining the plurality of semiconductor dies separated by streets in the semiconductor layers; depositing one or more metal layers above the semiconductor layers; removing at least a portion of the metal layers disposed in the streets; forming a first handling layer above the metal layers; removing the substrate to expose a surface of the semiconductor layers; adding a second handling layer to the exposed surface of the semiconductor layers; removing the first handling layer to expose a surface of the metal layers; applying an adhesive to the exposed surface of the metal layers; and removing the second handling layer.

Another embodiment of the present invention is a method of fabricating a plurality of semiconductor dies. The method generally includes forming one or more semiconductor layers on a substrate; defining the plurality of semiconductor dies separated by streets in the semiconductor layers; depositing one or more metal layers above the semiconductor layers; depositing a barrier layer above the metal layers; removing at least a portion of the barrier layer and the metal layers disposed in the streets; forming a first handling layer above the barrier layer; removing the substrate to expose a surface of the semiconductor layers; adding a second handling layer to the exposed surface of the semiconductor layers; removing the first handling layer to expose the barrier layer; applying an adhesive to the barrier layer; and removing the second handling layer.

Yet another embodiment of the present invention is a method of fabricating a plurality of semiconductor dies. The method generally includes forming one or more semiconductor layers on a substrate; defining the plurality of semiconductor dies separated by streets in the semiconductor layers; depositing one or more connected conductor layers above the semiconductor layers; forming stop electroplating (EP) areas in the streets; depositing one or more metal layers above the connected conductor layers, wherein the stop EP areas discourage metal deposition in at least portions of the streets; removing the stop EP areas; removing at least a portion of the connected conductor layers disposed in the streets; forming a first handling layer above the metal layers; removing the substrate to expose a surface of the semiconductor layers; adding a second handling layer to the exposed surface of the semiconductor layers; removing the first handling layer to expose a surface of the metal layers; applying an adhesive to the exposed surface of the metal layers; and removing the second handling layer.

Yet another embodiment of the present invention is a method of fabricating a plurality of semiconductor dies. The method generally includes forming one or more semiconductor layers on a substrate; defining the plurality of semiconductor dies separated by streets in the semiconductor layers; depositing one or more connected conductor layers above the semiconductor layers; forming stop EP areas in the streets; depositing a plurality of metal layers above the connected conductor layers, wherein the stop EP areas discourage metal deposition in at least portions of the streets; removing the stop EP areas; depositing a barrier layer to protect the connected conductor layers and the metal layers; and removing the substrate to expose a surface of the semiconductor layers. Using this method, only the connected conductor layers may need to be cut through to separate the dies versus have to cut through thick metal layers. In this manner, the total thickness of the semiconductor dies dictated by packaging and the thickness of the street required for handling the semiconductor dies after the substrate is removed may be independently optimized.

Yet another embodiment of the present invention provides a method of fabricating a plurality of semiconductor dies. The method generally includes forming one or more semiconductor layers on a substrate, defining the plurality of semiconductor dies separated by streets in the semiconductor layers, depositing a first handling layer above the semiconductor layers, depositing a plurality of metal layers above the first handling layer, removing at least a portion of the metal layers disposed in the streets, removing the substrate to expose a surface of the semiconductor layers, and applying an adhesive above the metal layers.

Yet another embodiment of the present invention provides a method of fabricating a plurality of semiconductor dies. The method generally includes forming one or more semiconductor layers on a substrate; defining the plurality of semiconductor dies separated by streets in the semiconductor layers; depositing a first handling layer above the semiconductor layers; forming stop EP areas in the streets; depositing a plurality of metal layers above the first handling layer, wherein the stop EP areas discourage metal deposition in at least portions of the streets; removing the stop EP areas; removing at least a portion of the first handling layer disposed in the streets; removing the substrate to expose a surface of the semiconductor layers; and applying an adhesive above the metal layers.

Yet another embodiment of the present invention provides a method of fabricating a plurality of semiconductor dies. The method generally includes forming one or more semiconductor layers on a substrate, defining the plurality of semiconductor dies separated by streets in the semiconductor layers, depositing a handling layer above the semiconductor layers, forming stop EP areas in the streets, depositing a plurality of metal layers above the handling layer, wherein the stop EP areas discourage metal deposition in at least portions of the streets, and removing the stop EP areas.

Yet another embodiment of the present invention provides a method of fabricating a plurality of semiconductor dies. The method generally includes forming one or more semiconductor layers on a substrate; defining the plurality of semiconductor dies separated by streets in the semiconductor layers; depositing a handling layer above the semiconductor layers, wherein the thickness of the handling layer is dependent on a hardness of a material used in the handling layer; depositing a plurality of metal layers above the handling layer; removing the substrate to expose a surface of the semiconductor layers, wherein the handling layer provides a rigid support structure for the plurality of semiconductor dies for subsequent processing.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention provide techniques and structures useful for separating multiple semiconductor dies present on a wafer. This method can be applied to any semiconductor wafer with multiple dies, and the case of separating multiple vertical light-emitting diode (VLED) dies is provided as an example. In the figures that follow, only two dies are shown, but this is representative of multiple dies on the entire wafer.

An Exemplary Method of Separating Semiconductor Dies

Figure 1:
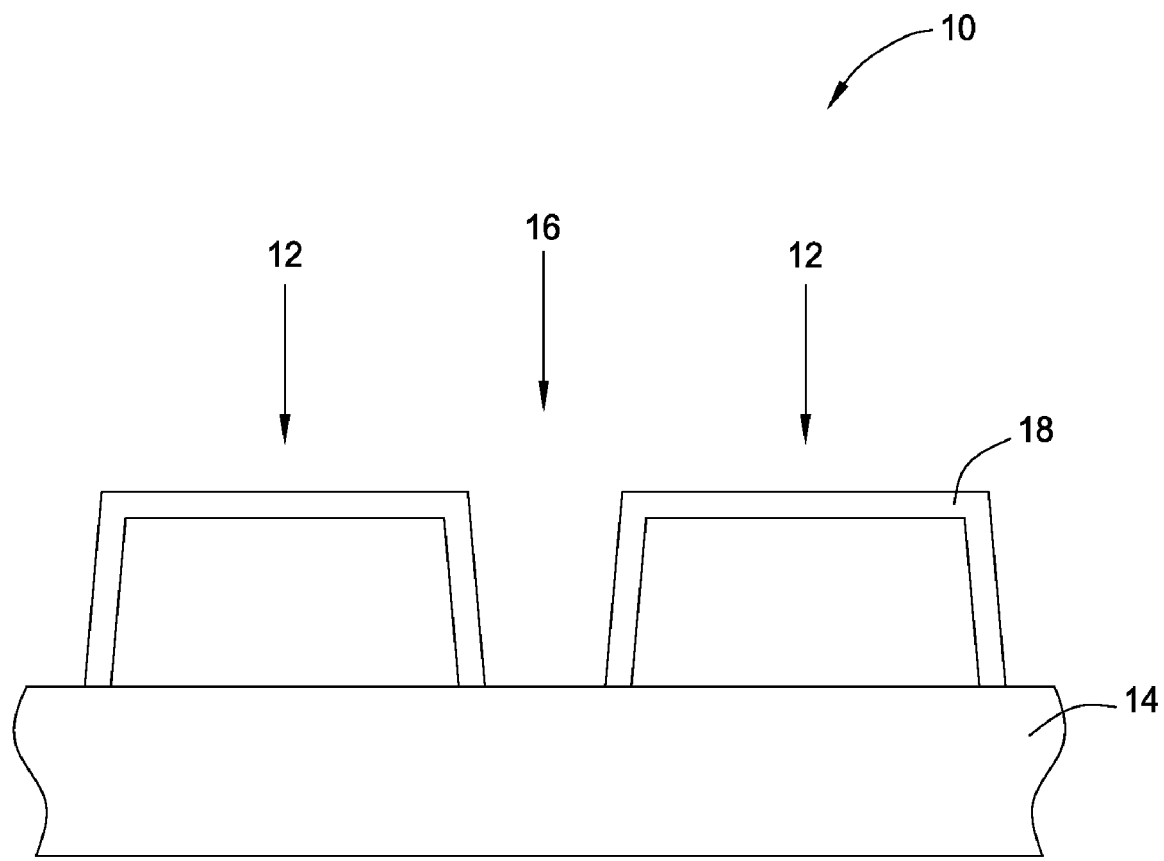
FIG. 1 illustrates adding a passivation layer to a semiconductor structure having at least two dies separated by a street in accordance with an embodiment of the invention.
Figure 1A:
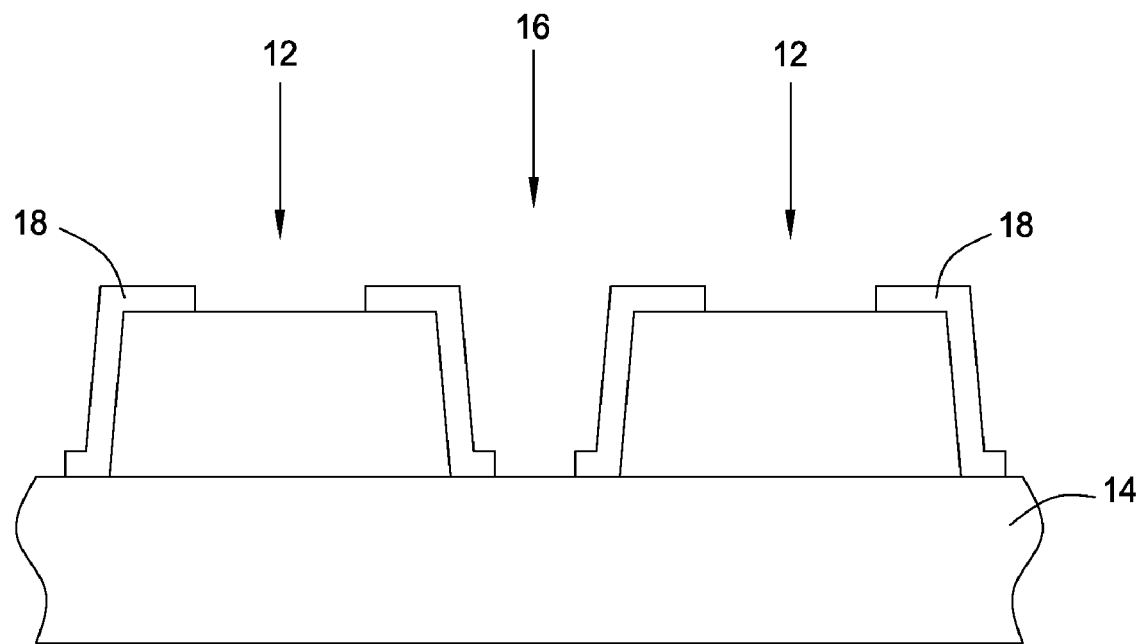
FIG. 1A illustrates removing portions of the passivation layer from the semiconductor structure in FIG. 1 in accordance with an embodiment of the invention.

Referring now to FIG. 1, a generic multilayered semiconductor structure 10 is provided with two different dies 12 disposed on a substrate 14 and separated by a street section, or simply "the street" 16. A passivation layer 18 may be deposited on the dies 12 with a portion of the passivation layer 18 removed as desired (e.g. for contact or grounding) for some embodiments as shown in FIG. 1A. The substrate 14 on which the dies 12 were formed may be composed of $SiO_2$, sapphire, GaAs, InP, InGaAsP, Si, ZnO, ZrN, or AlN.

Figure 2:
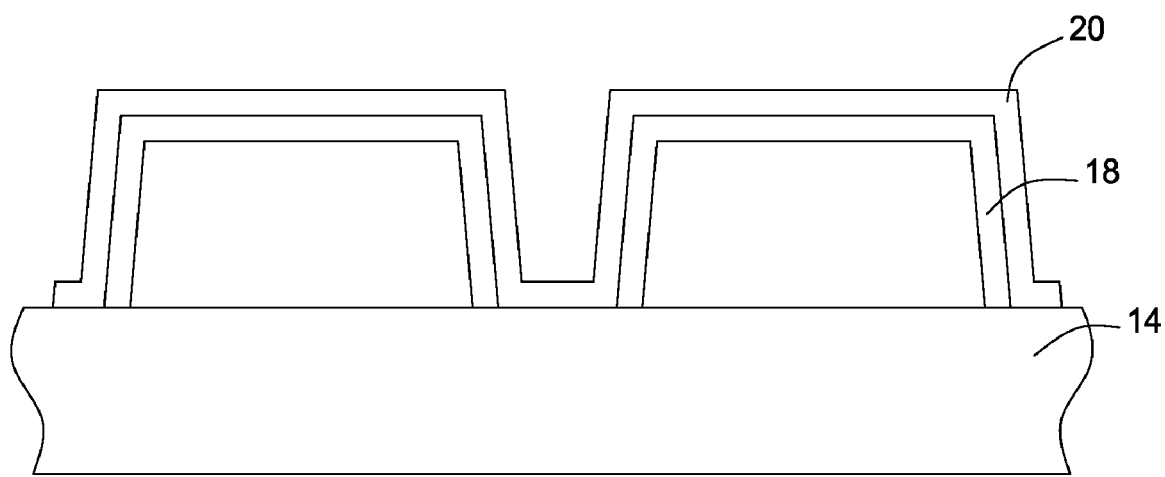
FIG. 2 illustrates forming a connected conductor above the semiconductor structure of FIG. 1 in accordance with an embodiment of the invention.

After passivation layers have been added with a portion of the passivation layers removed as desired, a connected conductor 20 may be deposited using at least one of several techniques including physical vapor deposition (PVD), evaporation, plasma spray, chemical vapor deposition (CVD), or electroless deposition to cover the entire semiconductor structure 10 of FIG. 1 (as illustrated in FIG. 2). From an initially deposited layer of the connected conductor 20, additional metal layers may be formed above the connected conductor 20 in an effort to further protect the underlying layers and/or to act as a seed layer for some embodiments. In multilayered implementations of the connected conductor 20, the individual metal layers may be composed of different metals, be formed using different techniques, and possess different thicknesses.

For some embodiments, a conductive handling layer (or continuous conductive metal layer) 21 may be deposited above the connected conductor 20. The purpose of the handling layer 21 may be to provide a rigid support structure for the wafer assembly such that the wafer assembly may be handled during subsequent processing once the substrate 14 has been removed. The handling layer 21 may also function, for some embodiments, as a seed layer for electroplating one or more layers of a metal substrate above the seed layer, as described below. The handling layer 21 may be deposited using electrochemical deposition, electroplating (EP), electroless chemical deposition, PVD, CVD, or evaporation. Typically, the handling layer 21 is formed as a continuous layer across the surface of the wafer assembly. Unlike some of the other types of handling layers described for subsequent wafer processing below, the handling layer 21 may be a permanent layer within the separated dies 12.

The handling layer 21 may comprise any electrically conductive material that is suitably hard for the desired thickness, such as Cr/Au (chromium-containing layer with a gold coating layer on top), Ni/Au (nickel-containing layer with a gold coating layer on top), Ti/Au (titanium-containing layer with a gold coating layer on top), Al/Ti (aluminum-containing layer with a titanium coating layer on top), Ag/Ti (silver-containing layer with a titanium coating layer on top), Ni/Pd/Au (nickel-containing layer with a palladium coating layer and a gold coating layer on top), Cr/Au/Ti/Ni/Au (chromium-containing layer with a gold coating layer, a titanium coating layer, a nickel coating layer, and another gold coating layer on top), Rh, Mo, Pd, Ru, Cu, Pd—Ru (layer containing palladium and ruthenium), Pt—Rh (layer containing palladium and rhodium), Ni—Co (layer containing nickel and cobalt), Cu—Co (layer containing copper and cobalt), Cu—Mo (layer containing copper and molybdenum), Cu/Ni—Co/Au (copper-containing layer coated with a layer containing nickel and cobalt and with a gold coating layer on top), Cu/Au (copper-containing layer with a gold coating layer on top), W/Au (tungsten-containing layer with a gold coating layer on top), TiW/Au (layer containing titanium and tungsten coated with a gold layer on top), Pt/Au (platinum-containing layer coated with a gold layer on top), Mo/Au (molybdenum-containing layer coated with a gold layer on top), Co/Au (cobalt-containing layer coated with a gold layer on top), Pd/Au (palladium-containing layer coated with a gold layer on top), Ag, Ag/Au (silver-containing layer coated with a gold layer on top), Au, Ni/Cu (nickel-containing layer coated with a copper layer on top), Cu/Ni—Co/Cu (copper-containing layer coated with a layer containing nickel and cobalt and with a copper coating layer on top), Cu/Ni—Co/Cu/Ni—Co (copper-containing layer coated with a layer containing nickel and cobalt, with a second copper-containing layer, and with a second layer containing nickel and cobalt on top), Cu/Rh/Cu (copper-containing layer coated with a rhodium-containing layer and with a copper-containing layer on top), Cu/Pd—Ru/Cu (copper-containing layer coated with a layer containing palladium and ruthenium and with a copper-containing layer on top), Ni/Cu—Mo (nickel-containing layer coated with a layer containing copper and molybdenum), or alloys thereof. The thickness of the handling layer 21 is typically greater than 1 μm. However, the particular thickness selected for any given application may depend on the hardness of the metal(s), metal alloy(s), or other material(s) used. For example, if a metal (alloy) with a hardness of 120 HV (where HV is the Vickers Hardness) is used, the handling layer 21 may have a thickness of approximately 40 μm, while if a metal (alloy) with a hardness of 500 HV is used, the handling layer 21 may have a thickness of 20 μm. The hardness of the handling layer 21 is typically greater than 100 HV, and may, for some embodiments, lie within the range 100 to 1000 HV. For some embodiments, the thickness of the handling layer 21 may be reduced in the street 16 to aid in the process of separating the dies 12.

Figure 3:
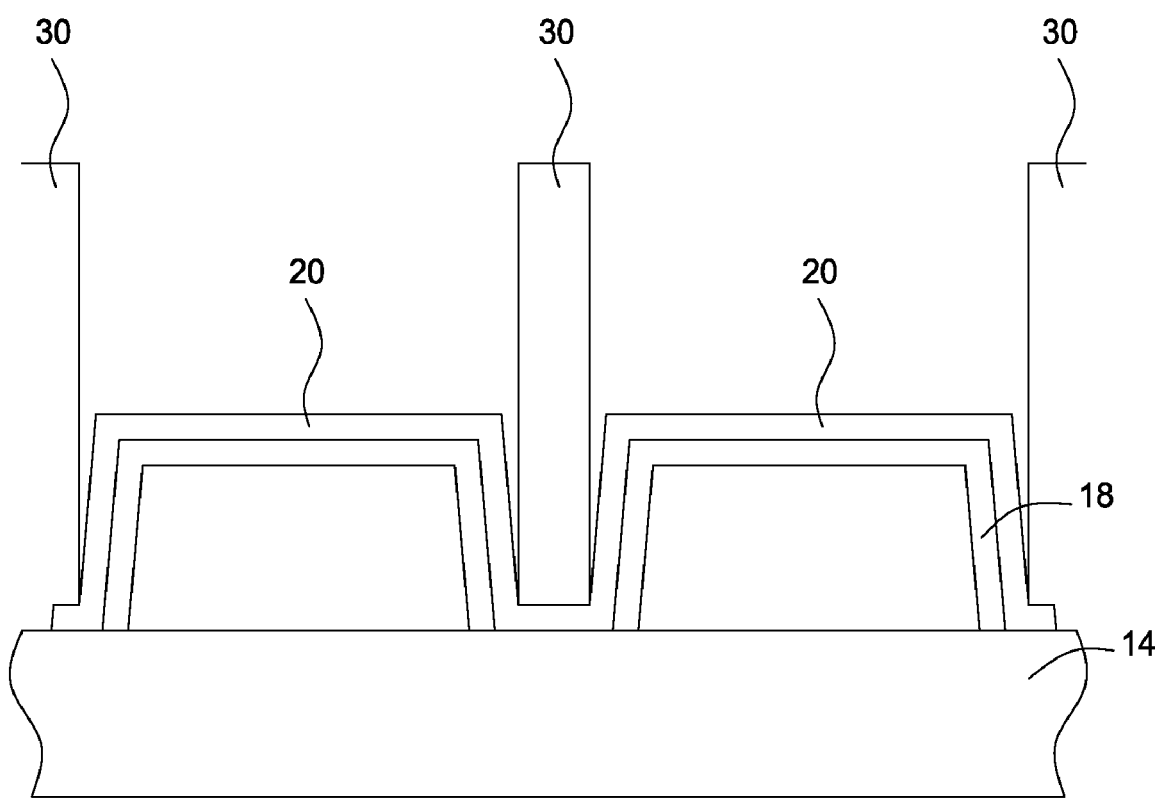
FIG. 3 illustrates adding a stop electroplating (EP) area in the streets of the structure in FIG. 2 in accordance with an embodiment of the invention.
Figure 3A:
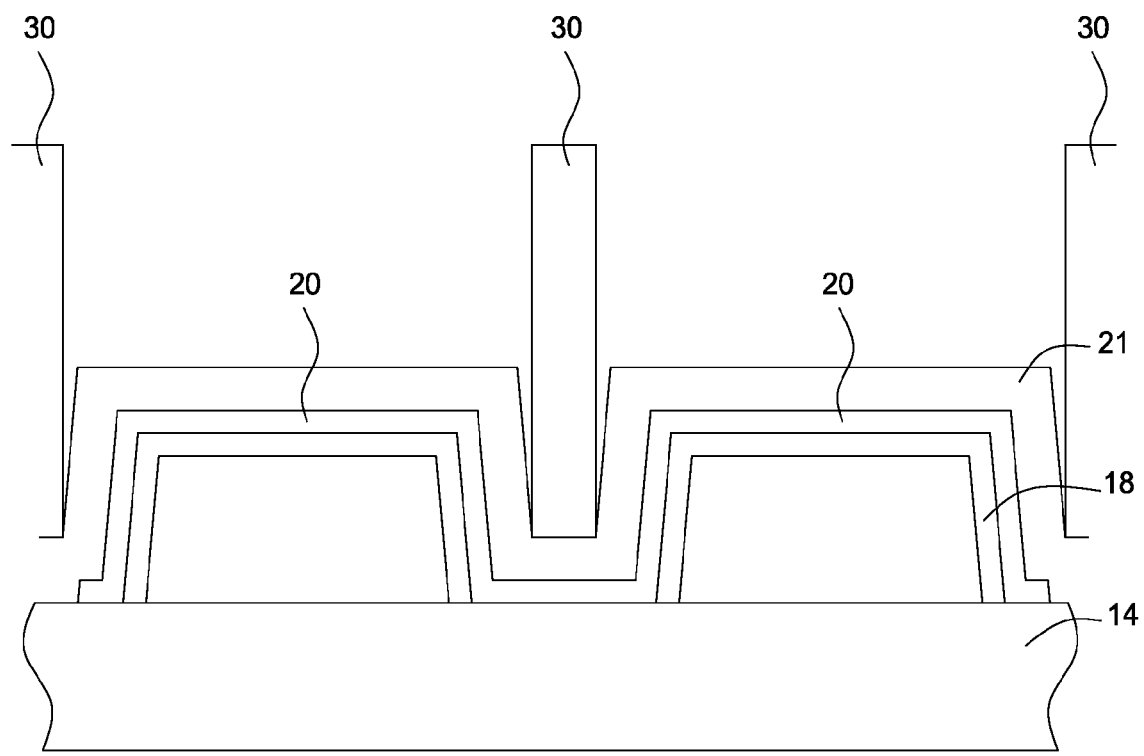
FIG. 3A illustrates adding a handling layer above the semiconductor structure of FIG. 2 and adding a stop EP area in the streets of the structure in accordance with an embodiment of the invention.

Once the desired number of metal layers has been created, a mass of material that resists electroplating (EP), referred to as the stop EP area (or layer) 30, may be formed using a mask or other suitable techniques and may most likely be positioned only above the street 16 as shown in FIGS. 3 and 3A. In this manner, the stop EP area 30 blocks the growth of metal on at least a portion of the street 16. The stop EP area 30 may be composed of a non-conductive material and may be photosensitive or non-photosensitive. Suitable material for the stop EP area 30 may include a polymer, a polyimide, epoxy, a resist, thermoplastic, a parylene, a dry film resist, SU-8, NR7, silicone, ceramic, or any suitable carbon-containing organic material. The thickness of the stop EP area 30 is typically greater than 1 μm.

Figure 4:
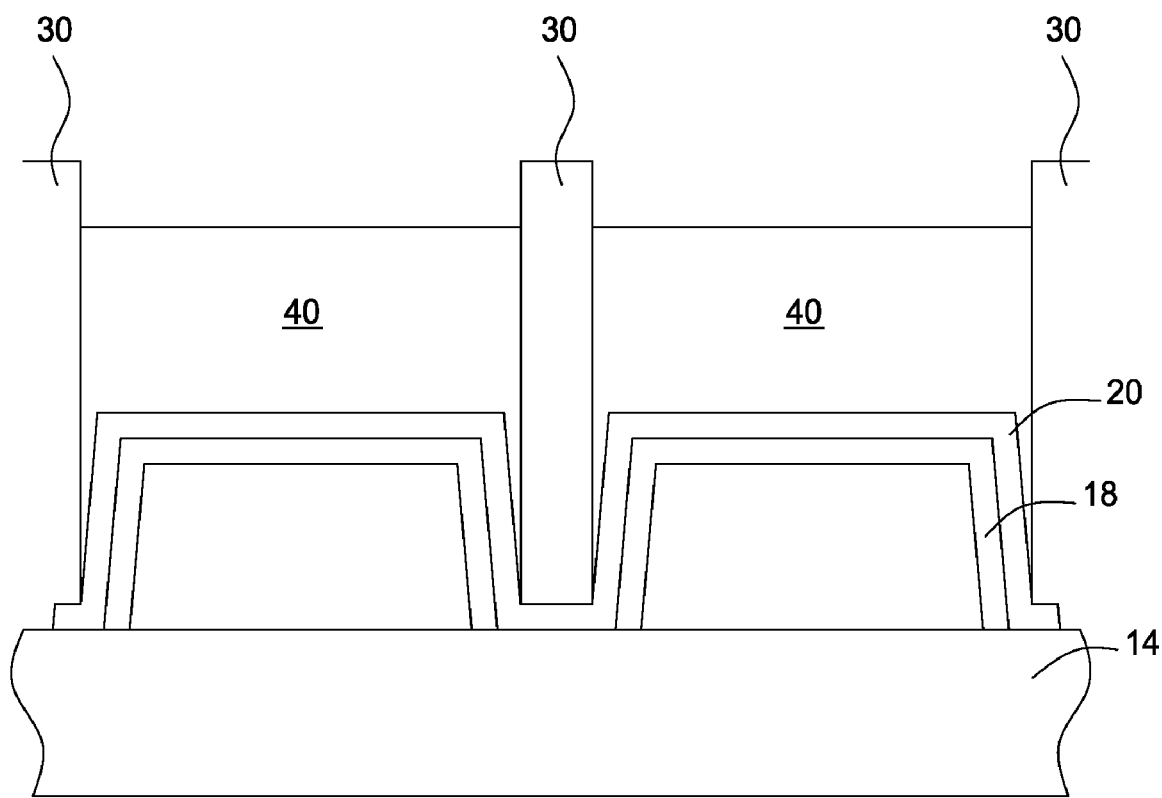
FIG. 4 illustrates depositing a conductive metal layer above the dies of FIG. 3 in accordance with an embodiment of the invention.
Figure 4A:
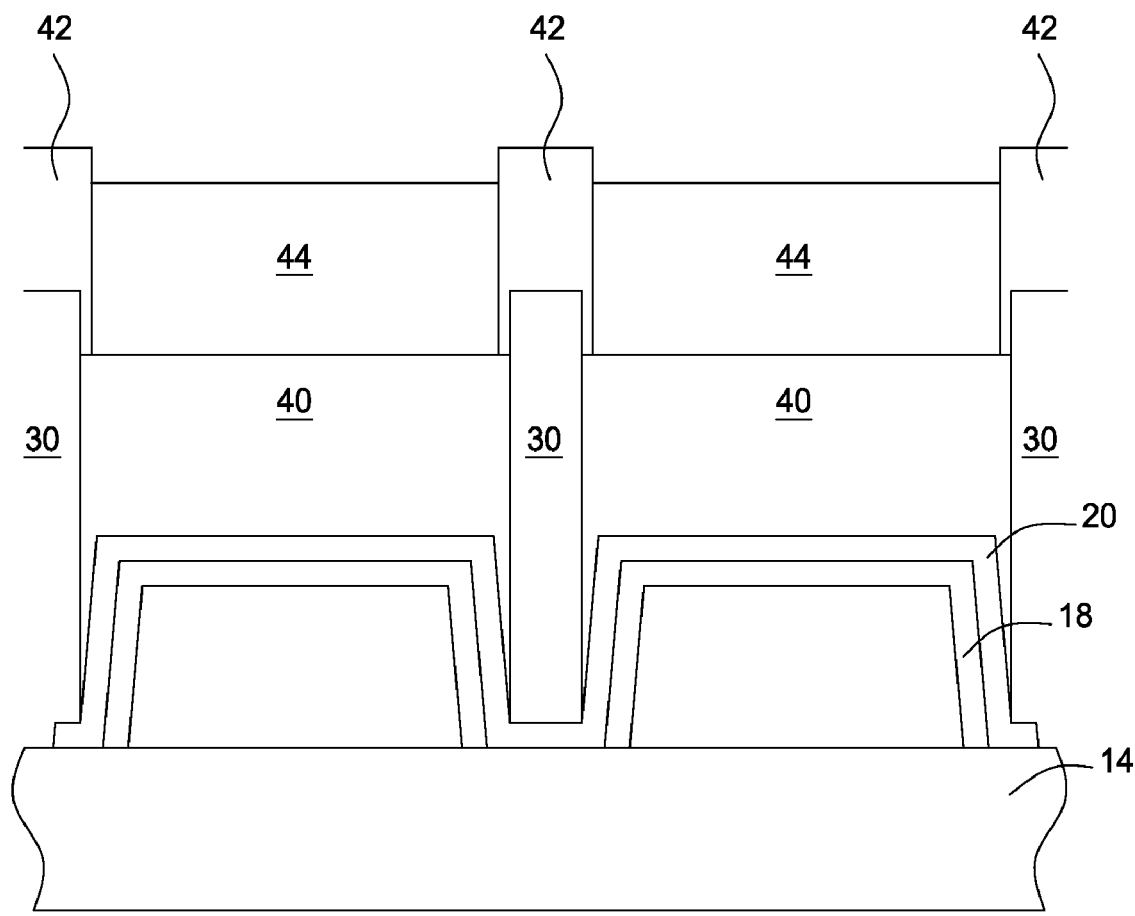
FIG. 4A illustrates adding an additional stop EP area and an additional conductive metal layer above the structure of FIG. 4 in accordance with an embodiment of the invention.
Figure 4B:
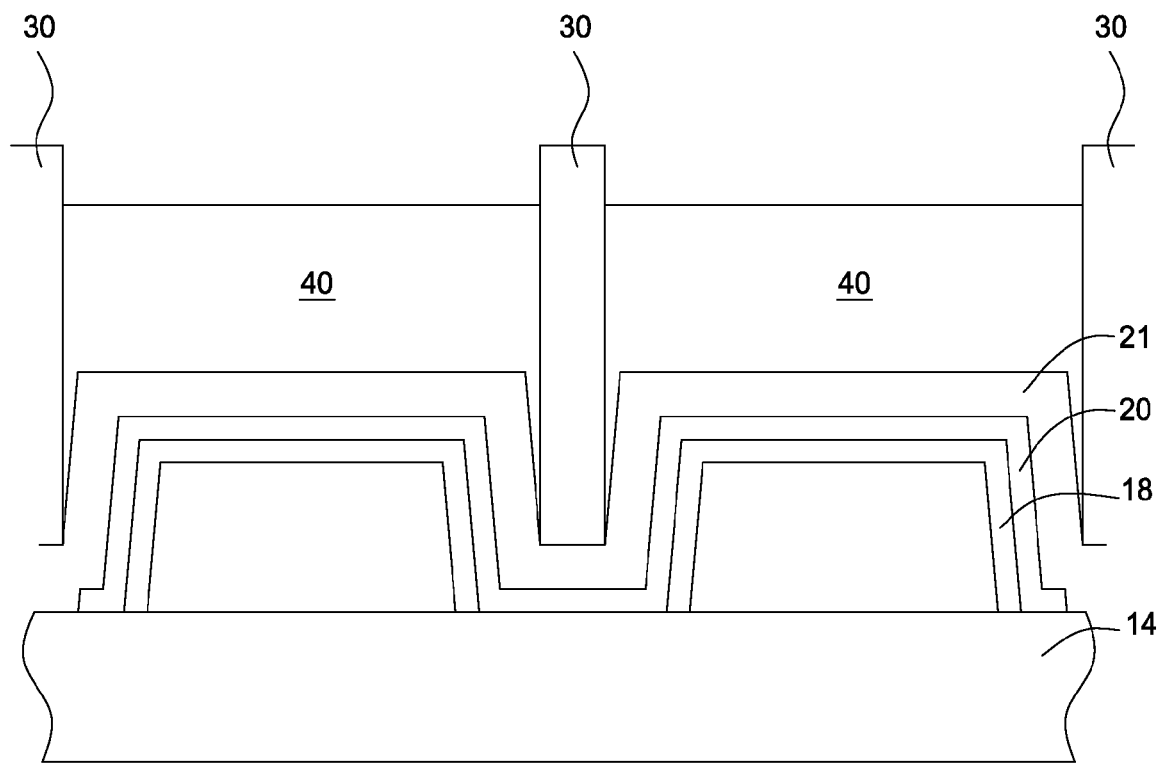
FIG. 4B illustrates depositing a conductive metal layer above the dies of FIG. 3A in accordance with an embodiment of the invention.
Figure 4C:
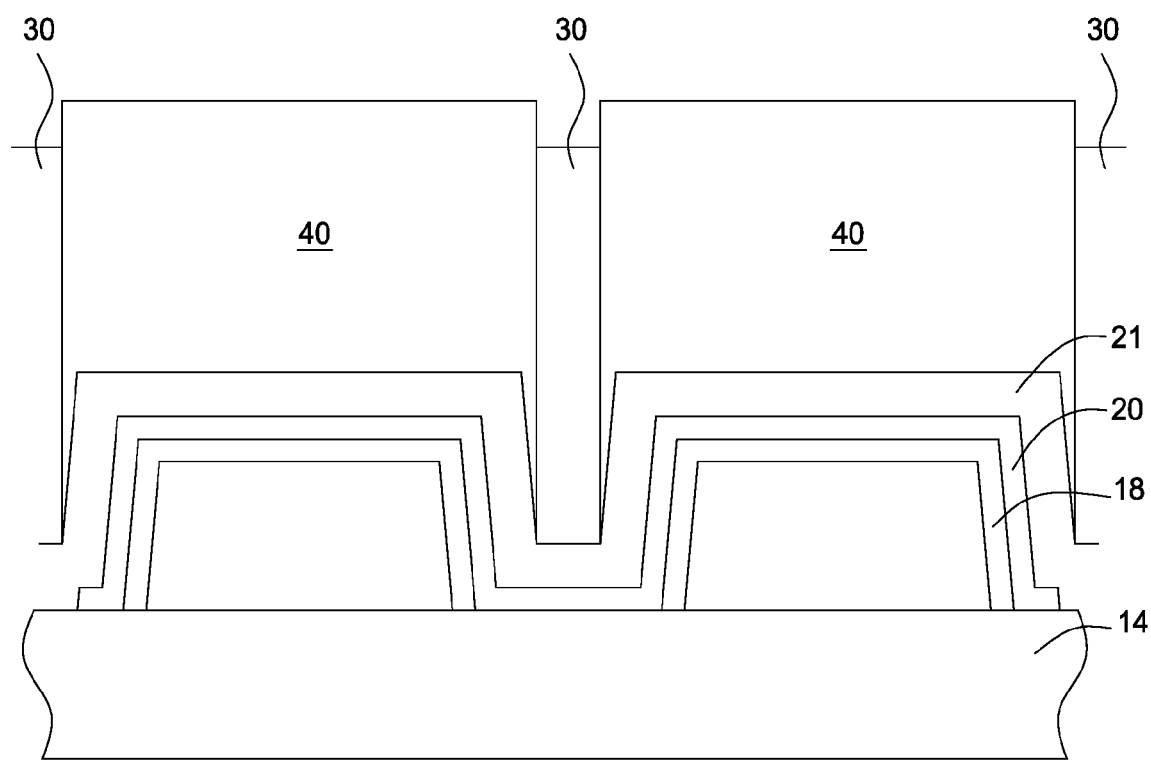
FIG. 4C illustrates depositing a conductive metal layer above the dies of FIG. 3A to be higher than the stop EP area in accordance with an embodiment of the invention.

Suitable deposition techniques, such as CVD, PVD, electroplating (EP) or electroless plating, may then be used to grow a conductive metal layer 40 above the semiconductor structure 10 as depicted in FIGS. 4 and 4B. Serving as a metal substrate for the dies 12, the conductive metal layer 40 may comprise a single layer or multiple layers, consisting of single metals or metal alloys in either case. The thickness of the conductive metal layer 40 may be greater than 1 μm, but should be controlled so that the conductive metal layer 40 on top of one die 12 is not connected to that above another die 12. If the top of the conductive metal layer 40 rests above the stop EP area 30, as in FIG. 4C, an additional process step may be used to remove the excess material of the conductive metal layer 40 above the stop EP area 30 before removing the stop EP area 30. Removal techniques, such as lapping, grinding, polishing, chemical mechanical polishing (CMP), or metal etching may be used. It is possible to form a thicker conductive metal layer by forming additional stop EP areas 42 (or layers) and additional conductive metal layers 44 above the initially formed layers 30, 40 as illustrated in FIG. 4A.

Figure 5:
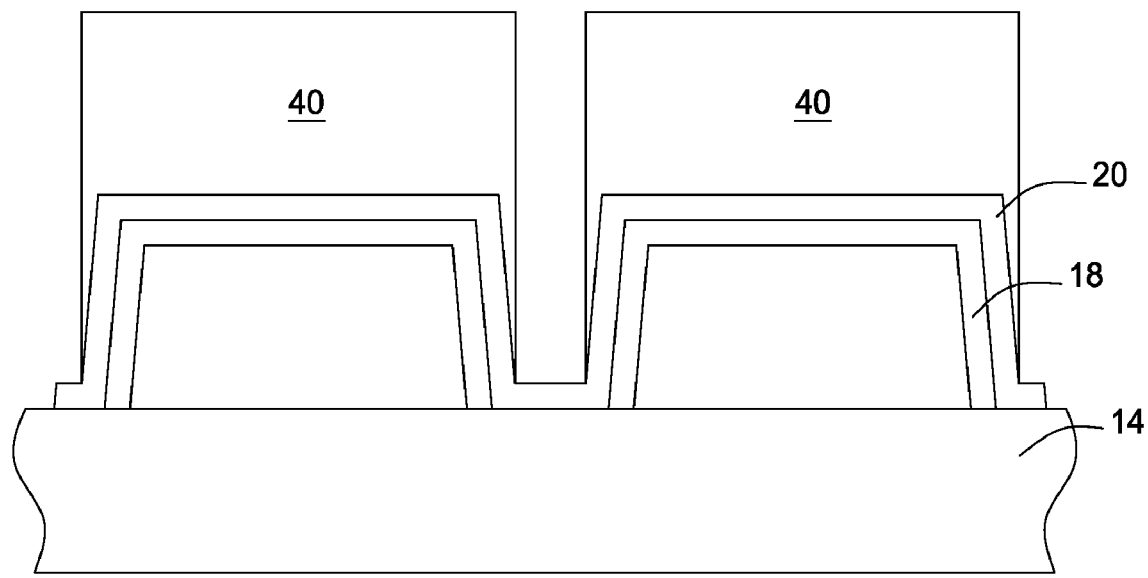
FIG. 5 illustrates removing the stop EP area from the structure in FIG. 4 in accordance with an embodiment of the invention.
Figure 5A:
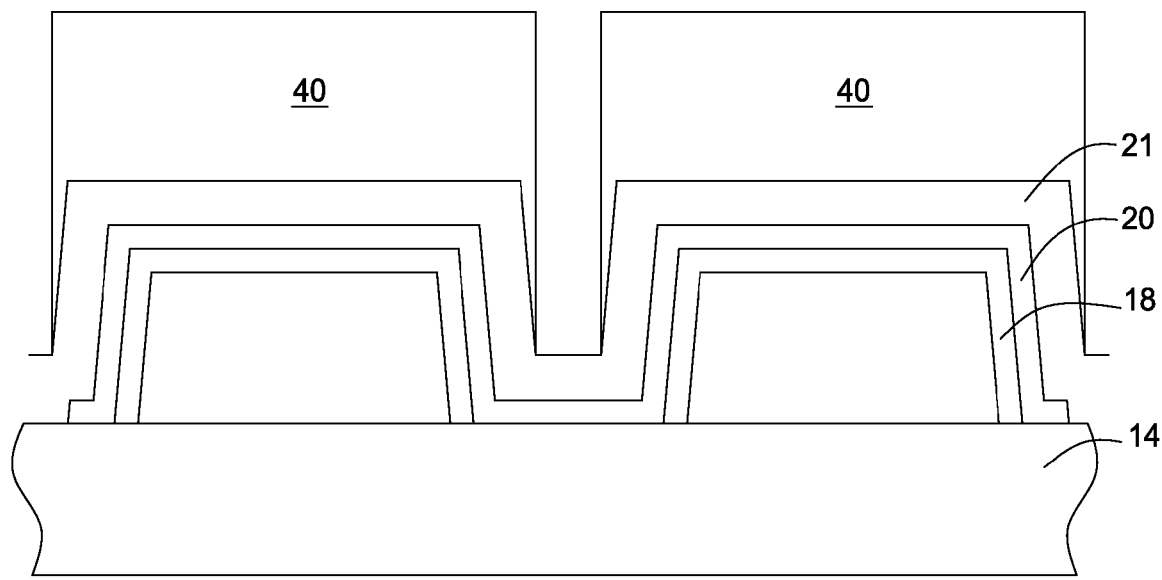
FIG. 5A illustrates removing the stop EP area from the structure in FIG. 4B in accordance with an embodiment of the invention.
Figure 6:
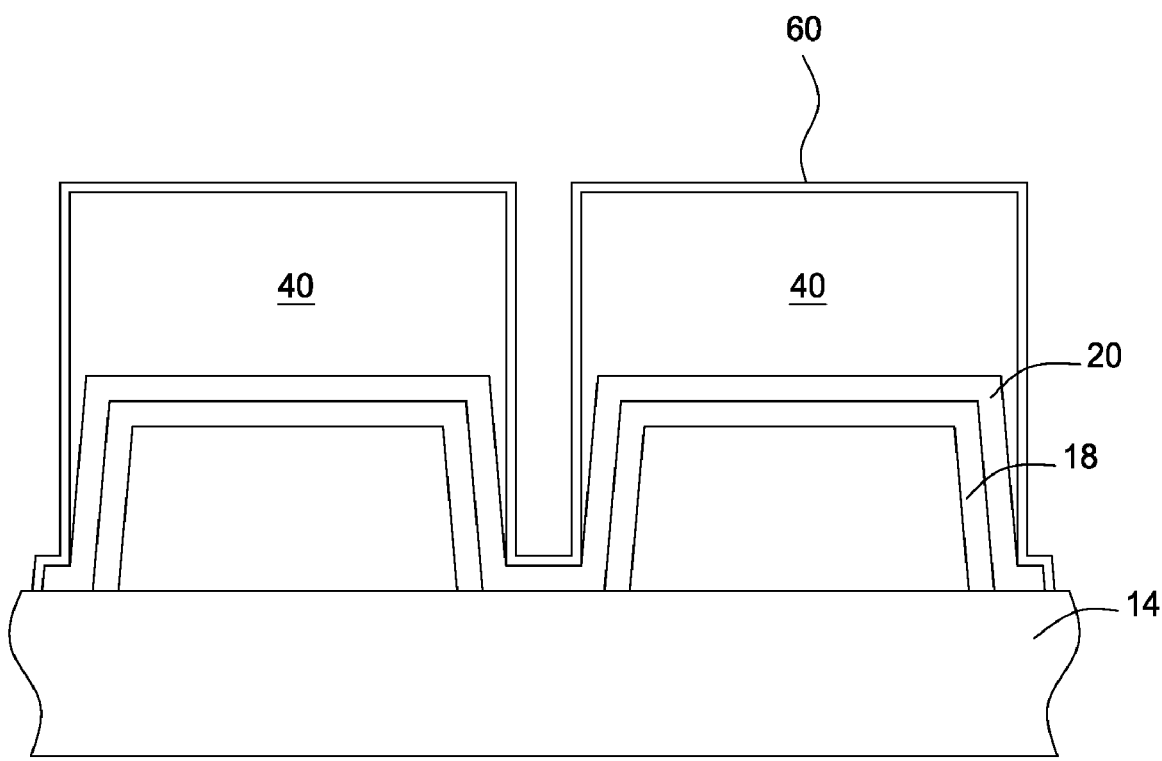
FIG. 6 illustrates forming a barrier layer above the structure in FIG. 5 in accordance with an embodiment of the invention.
Figure 6A:
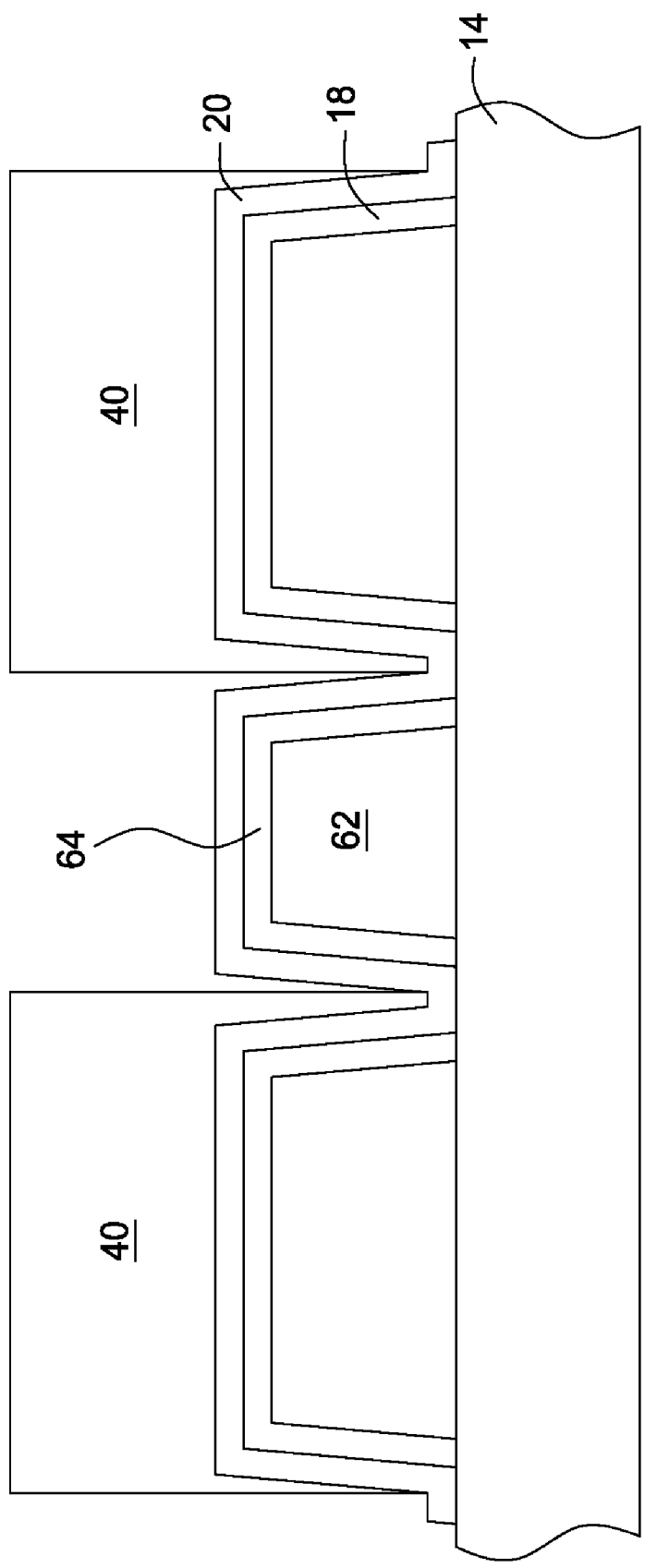
FIG. 6A illustrates having a street structure covered by a sacrificial layer disposed in the street of FIG. 5 in accordance with an embodiment of the invention.
Figure 6B:
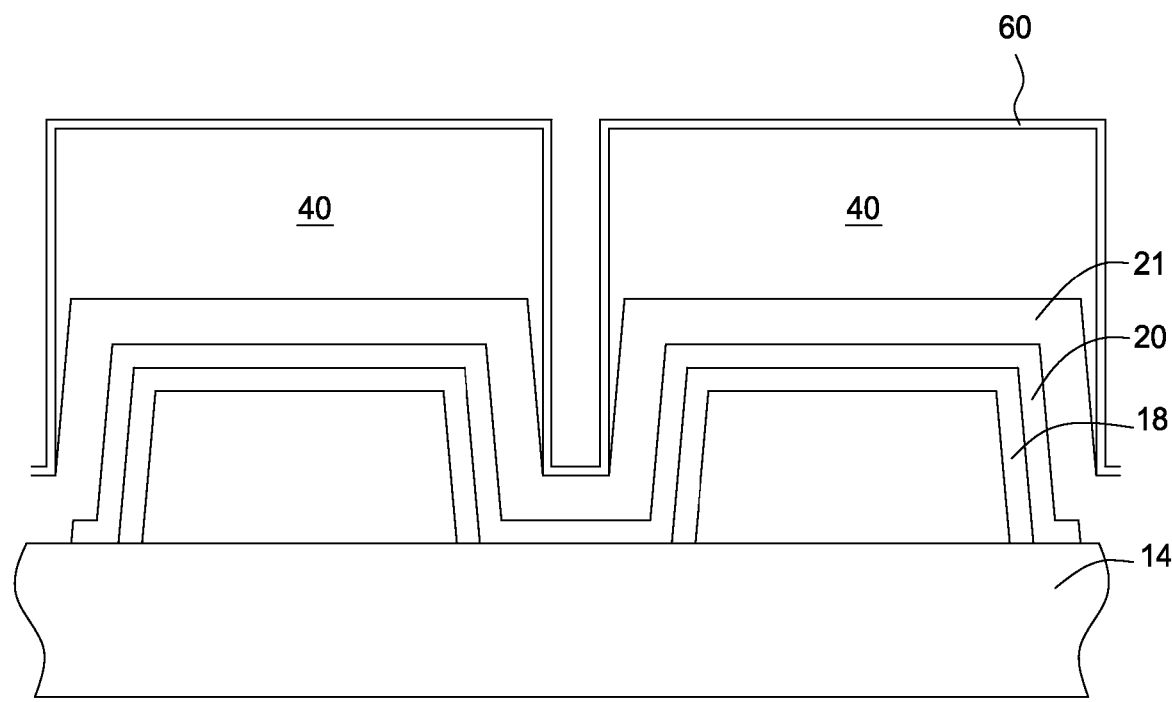
FIG. 6B illustrates forming a barrier layer above the structure in FIG. 5A in accordance with an embodiment of the invention.

Referring to FIGS. 5 and 5A, the stop EP area 30 may be eradicated using, for example, wet etching, dry etching, or other means. A barrier layer 60, which may comprise a single layer or multiple formed layers, may then be formed covering the total area of the conductive metal layer 40 and the street 16, as portrayed in FIGS. 6 and 6B. For some embodiments, the street 16 may have other particular materials depending on the structure, such as a street structure 62 covered by a sacrificial layer 64 as shown in FIG. 6A, on which the barrier layer 60 may be deposited.

For some embodiments, the barrier layer 60 may be a conductor. For example, the barrier layer 60 may comprise Cr/Au (chromium-containing layer with a gold coating layer on top), Ni/Au (nickel-containing layer with a gold coating layer on top), Ti/Au (titanium-containing layer with a gold coating layer on top), Al/Ti (aluminum-containing layer with a titanium coating layer on top), Ag/Ti (aluminum-containing layer with a titanium coating layer on top), Cr/Au/Ti/Ni/Au, Ni/Pd/Au (nickel-containing layer coated with a palladium-containing layer and a gold-containing layer on top), or Ti/Ni/Au). For other embodiments, the barrier layer 60 may comprise a semiconductor (e.g., Si, GaAs, GaP, or InP) or an insulator (e.g., a polymer, a polyimide, epoxy, a parylene, a resist, a dry film resist, thermoplastic, silicone, ceramic, $SiO_2$, $Si_3N_4$, ZnO, $Ta_2O_5$, $TiO_2$, HfO, or MgO). The purpose of the barrier layer will be made clear below.

Figure 7:
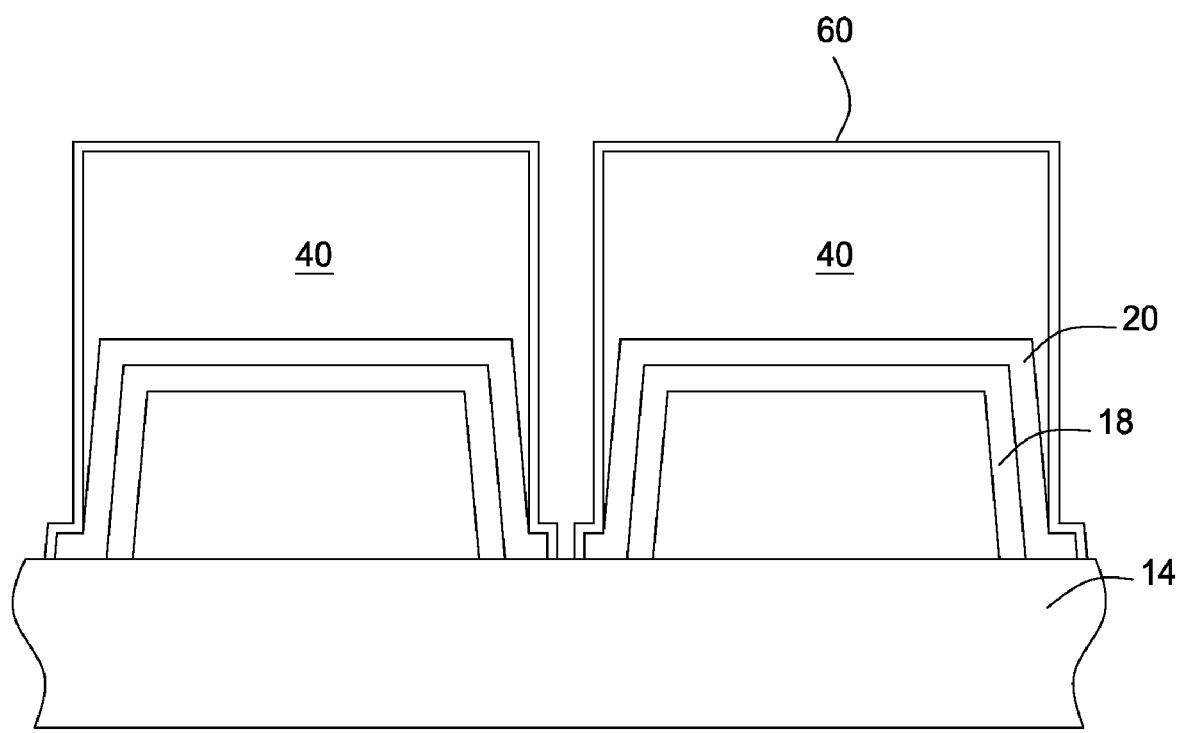
FIG. 7 illustrates removing a portion of the barrier layer, the connected conductor, and the passivation layer in the street of FIG. 6 in accordance with an embodiment of the invention.

Once the barrier layer 60 has been generated, a portion of the metals and barrier layer 60 above the street 16 may be removed (FIG. 7). The removal of the barrier layer 60, any intermediate metal layers, and the connected conductor 20 may be accomplished by any suitable means, such as dry etching (inductively coupled plasma/reactive ion etching, or ICP/RIE), laser cutting, saw cutting, wet etching, or a water jet.

Figure 8:
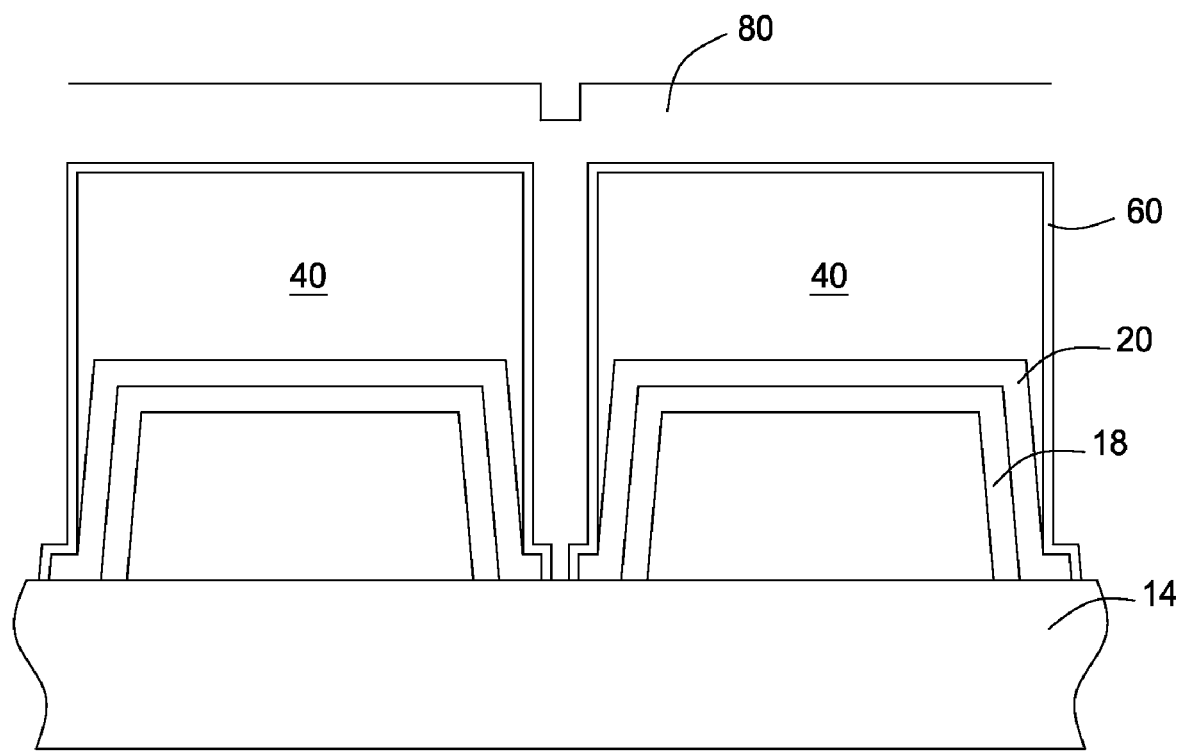
FIG. 8 illustrates adding a temporary sacrificial handling layer above the structure of FIG. 7 in accordance with an embodiment of the invention.

Referring to FIG. 8, a temporary sacrificial handling layer 80 may be formed covering the entire structure. The temporary sacrificial handling layer 80 may comprise any suitable type of material layers, such as conductor, semiconductor, or insulator layers. The thickness of the temporary sacrificial handling layer 80 is typically greater than 1 μm; the preferred thickness may be between 5 μm and 1000 μm.

Figure 8A:
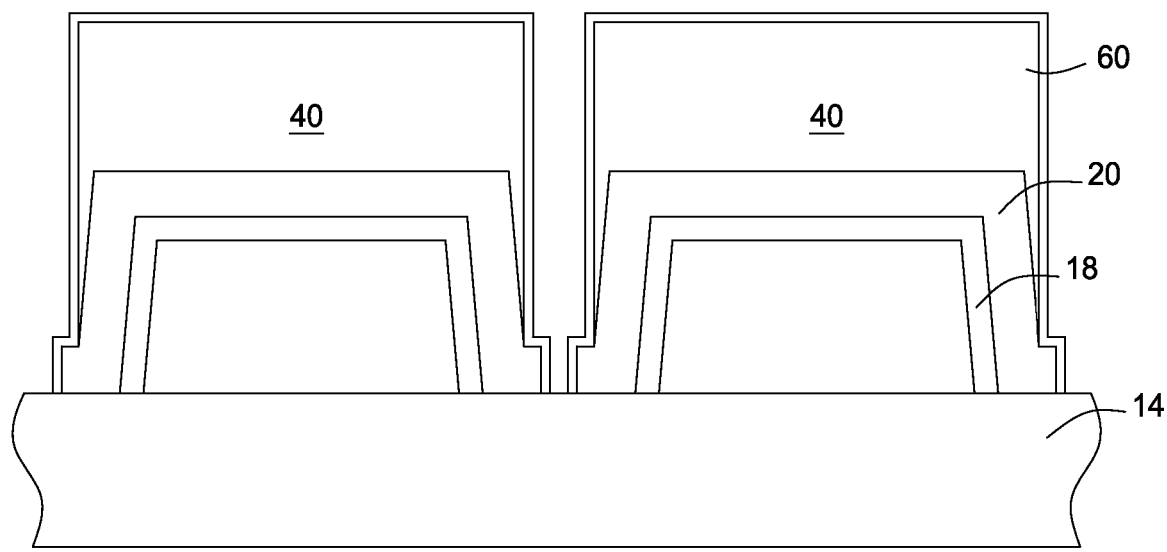
FIG. 8A illustrates providing a thickened connected conductor such that a temporary sacrificial handling layer may not be employed in accordance with an embodiment of the invention.

For some embodiments as illustrated in FIG. 8A, the thickness of the connected conductor 20 may be increased in an effort to bolster the structure and provide a sturdy frame for handling. The connected conductor thickness may be increased from that of FIG. 2, for example, by depositing an additional number of layers or by depositing more material in each of the layers. In such embodiments, a temporary sacrificial handling layer 80 may not be employed.

Figure 9:
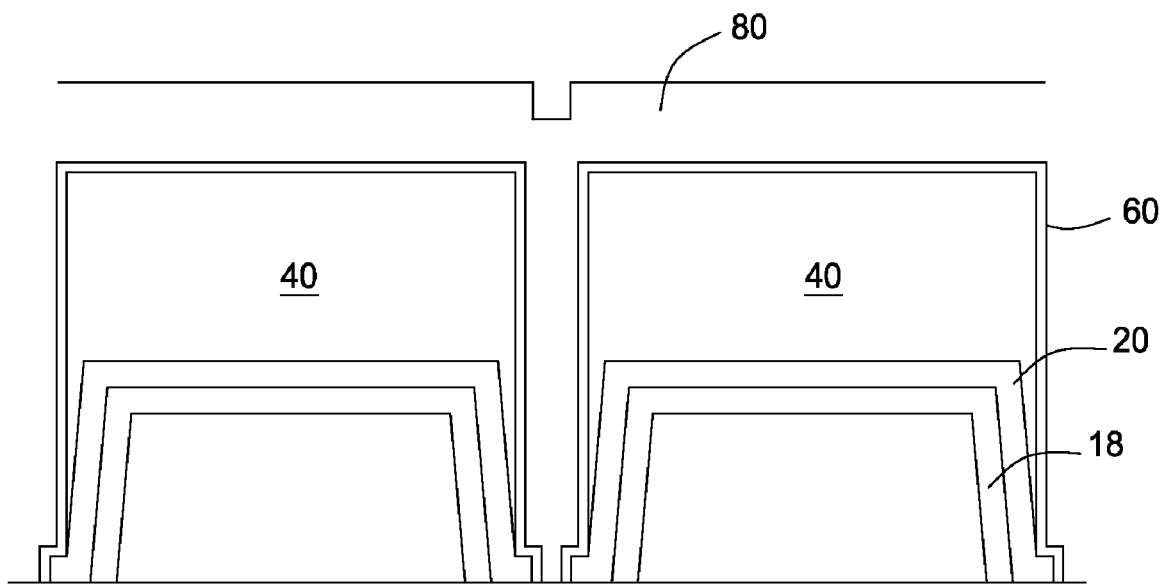
FIG. 9 illustrates removing the substrate from the structure of FIG. 8 in accordance with an embodiment of the invention.
Figure 9A:
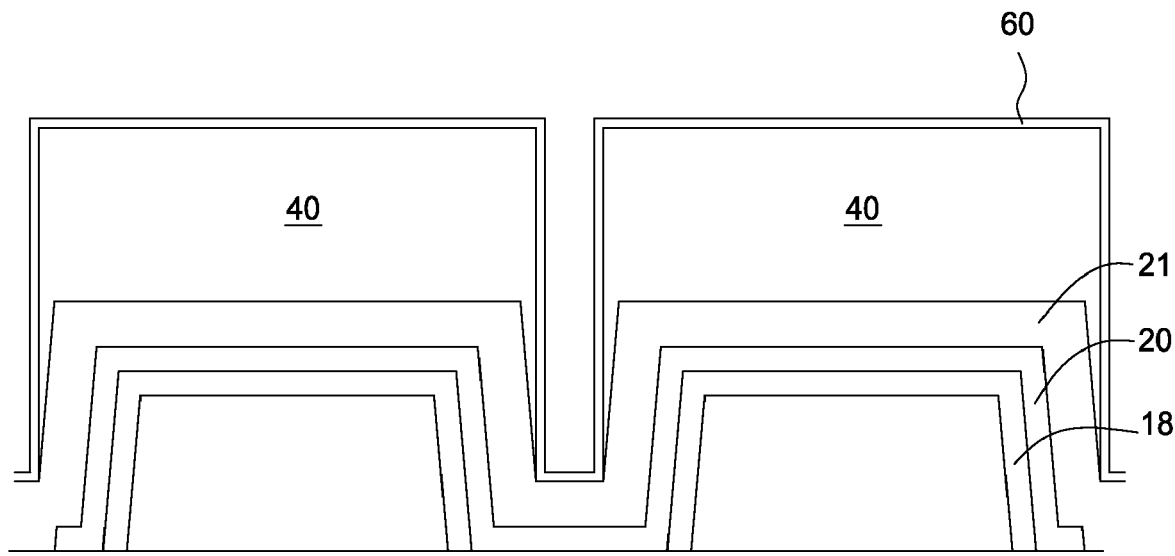
FIG. 9A illustrates removing the substrate from the structure of FIG. 6B in accordance with an embodiment of the invention.

Now that a second structure (the temporary sacrificial handling layer 80) has been added to hold the wafer assembly together during handling and die cutting, the substrate 14 may be removed as shown in FIG. 9. Removal of the substrate 14 may be accomplished by any suitable technique or combinations thereof, such as plasma etching, wet chemical etching, photo-enhanced chemical etching, laser lift-off, grinding, or polishing. For some embodiments as illustrated in FIG. 9A, the substrate 14 may be removed from a structure that does not have a temporary sacrificial handling layer 80 but has the more permanent handling layer 21 to bolster the structure and provide a sturdy frame for handling.

For the case in FIG. 6A where there is other material on the street 16 (e.g., the street structure 62), the material on the street 16 may be removed, for example, by dry etching, cutting, or wet etching. The street structure 62 or other material on the street 16 may be taken away by lifting before or after the temporary sacrificial handling layer 80 is removed.

Figure 10:
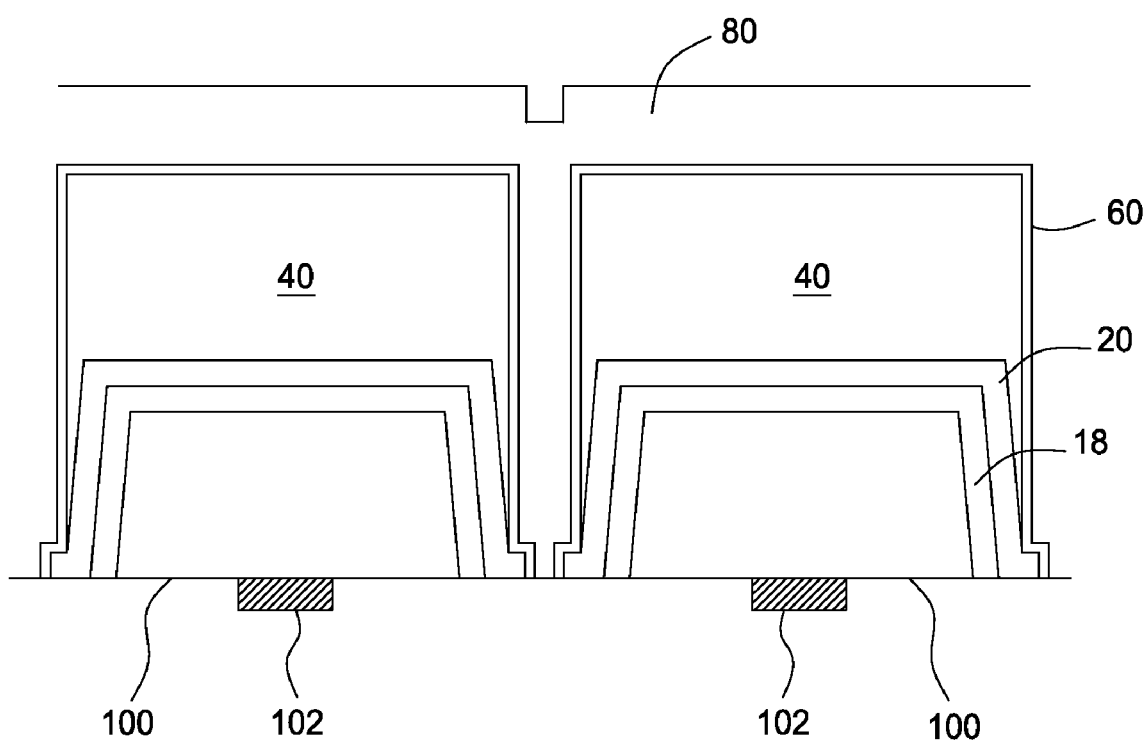
FIG. 10 illustrates adding bonding pads to the exposed bottom surface of the structure in FIG. 9 in accordance with an embodiment of the invention.
Figure 10A:
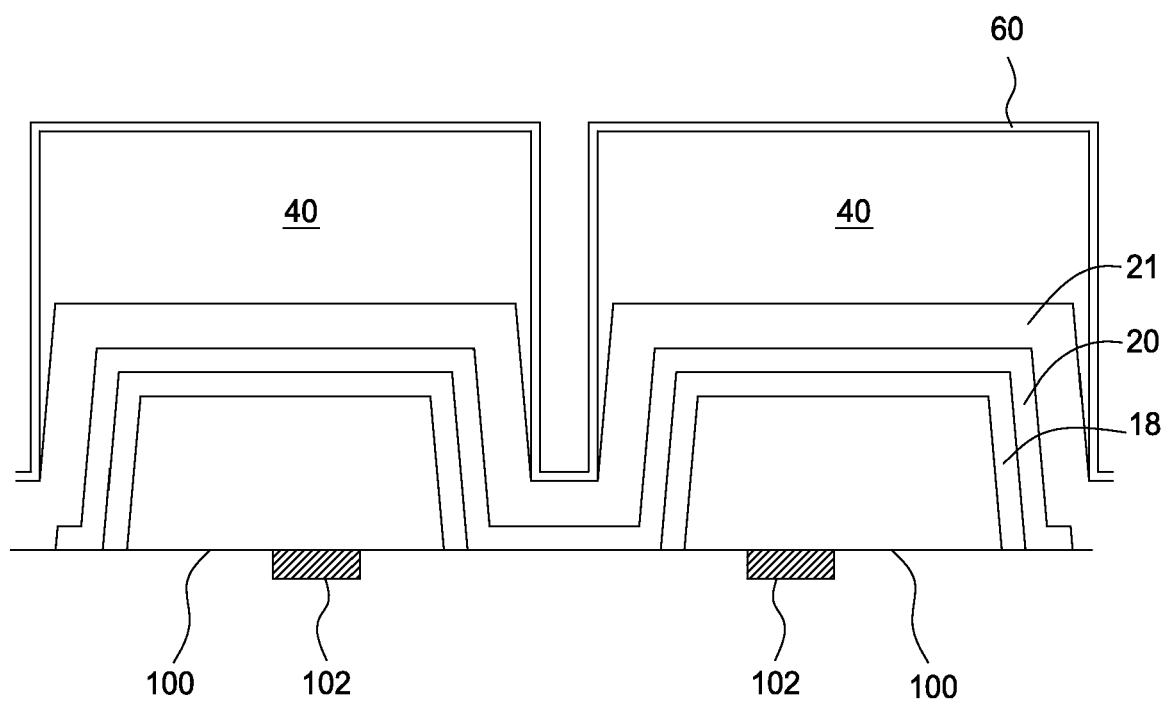
FIG. 10A illustrates adding bonding pads to the exposed bottom surface of the structure in FIG. 9A in accordance with an embodiment of the invention.

Once the substrate 14 has been removed, the bottom surface 100 of the device should be exposed and may be operated on as depicted in FIGS. 10 and 10A. Bonding pads 102 and any desired circuit pattern on the remaining semiconductor material may then be fabricated on the underside of the working structure.

Figure 11:
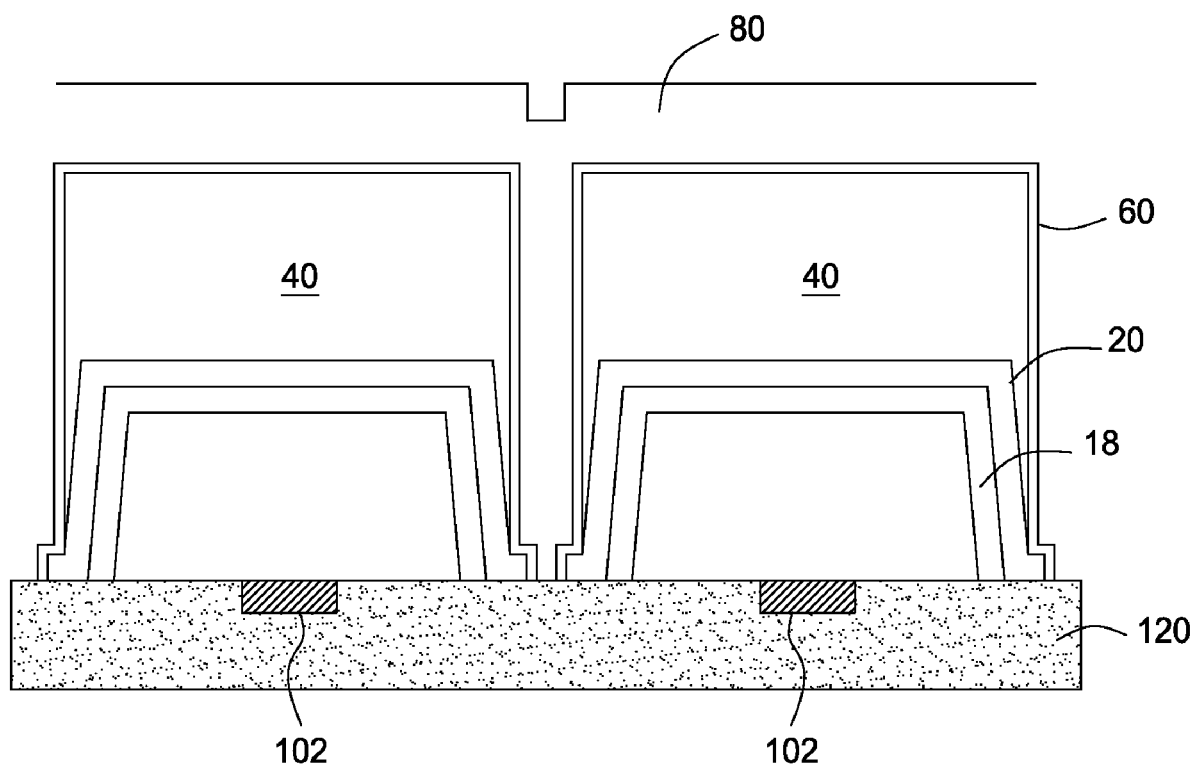
FIGS. 11 and 11A illustrate adding a protective layer and other materials to the structure of FIG. 10 in accordance with an embodiment of the invention.
Figure 11A:
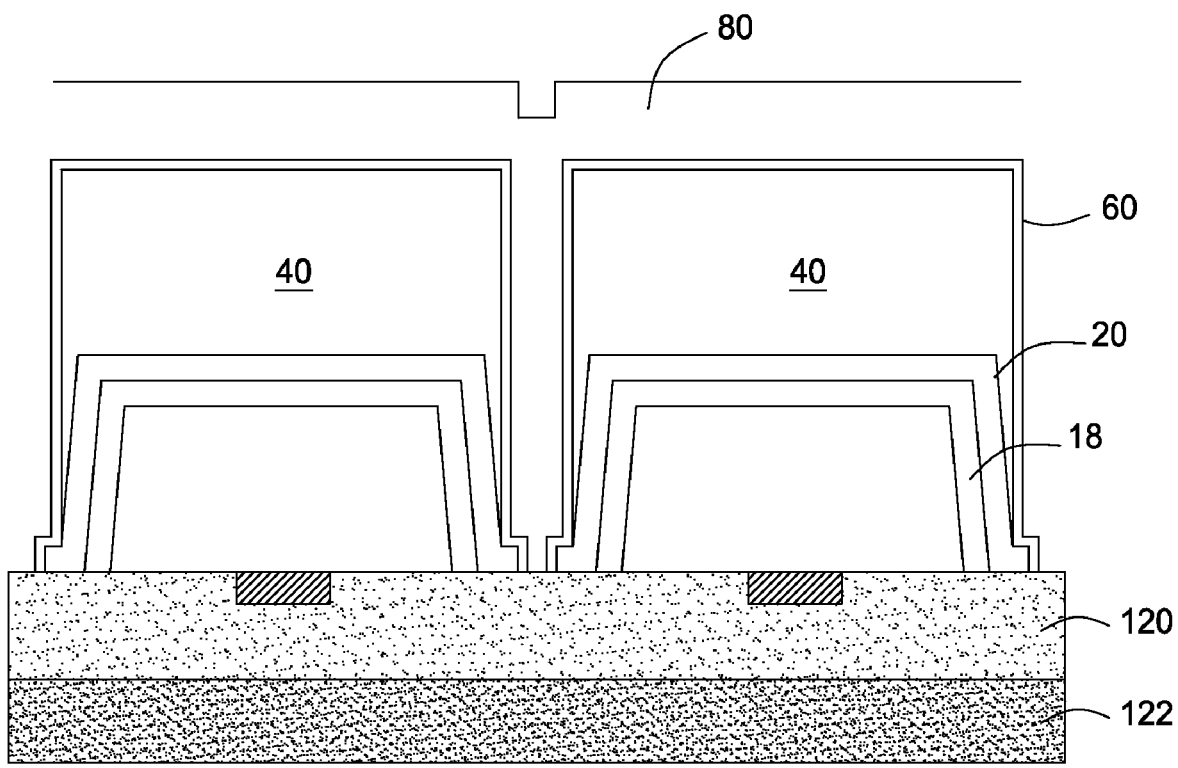
Figure 11B:
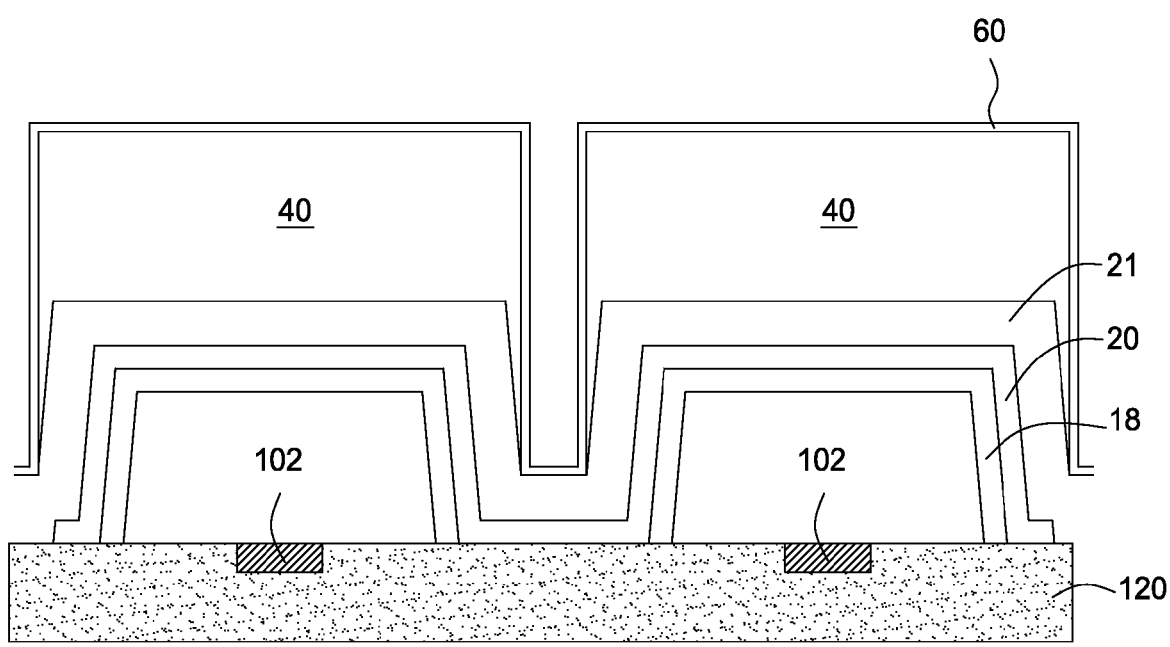
FIG. 11B illustrates adding a protective layer to the structure of FIG. 10A in accordance with an embodiment of the invention.

Afterwards, the bottom surface 100 of the semiconductor wafer assembly with patterning and bonding pads 102 may be treated with tape, wax, epoxy, or other materials or a combination of materials forming a protective layer 120, as illustrated in FIGS. 11 and 11B. The protective layer 120 is typically greater than 1 μm and may comprise a conductor (e.g., Cr/Au, Ni/Au, Ti/Au, Al/Ti/Ag/Ti, Ti/Au, Cr/Au/Ti/Ni/Au, Ni/Pd/Au, or Ti/Ni/Au), a semiconductor (e.g., Si, GaAs, GaP, or InP), or an insulator (a polymer, a polyimide, epoxy, a parylene, a resist, a dry film resist, thermoplastic, $SiO_2$, $Si_3N_4$, ZnO, $Ta_2O_5$, $TiO_2$, HfO, or MgO) or a combination of these materials. As shown in FIG. 11A, one could also attach other materials 122 to the protective layer 120 to enhance handling (e.g., sapphire, Si, Mo, Cu, or Al).

Figure 12:
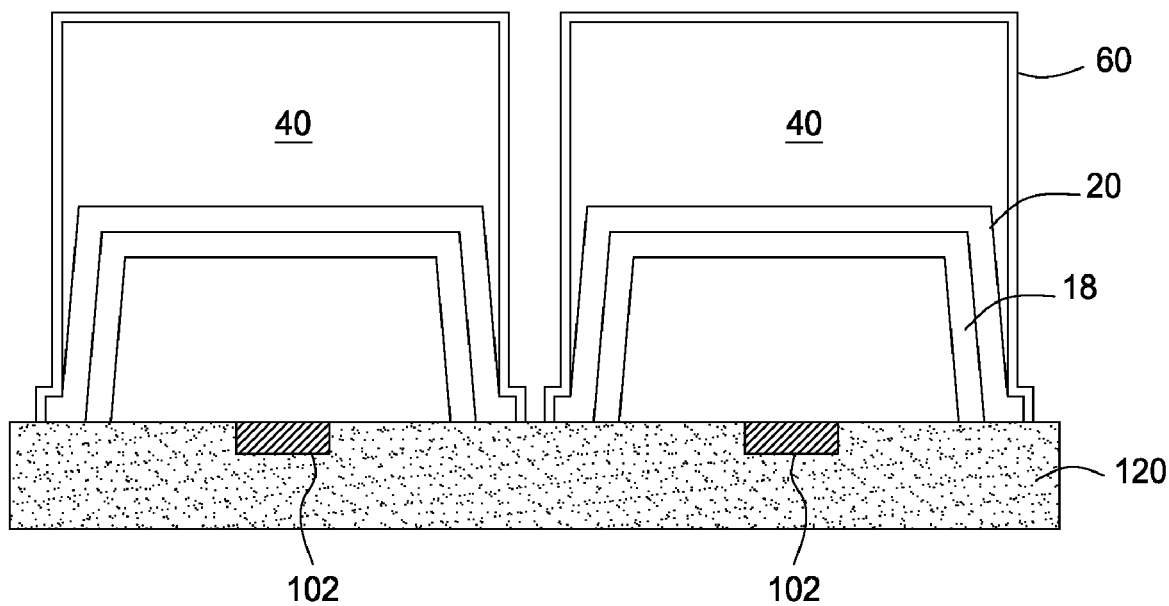
FIG. 12 illustrates removing the temporary sacrificial handling layer from the structure of FIG. 11 in accordance with an embodiment of the invention.

Because the individual semiconductor dies 12 already having the intended conductive metal layers 40 and the bonding pads 102 and/or circuitry are held together by the protective layer 120, the temporary sacrificial handling layer 80 may no longer be necessary. For some embodiments, to remove this handling layer 80, chemical solutions such as acid, (e.g., $H_3PO_4$, $HNO_3$, or $H_2SO_4$), alkaline (e.g., KOH or NaOH), solvent, or an oxidizer-containing solution (e.g., $H_2O_2$, $FeCl_3$, or KClO), may be used to remove the temporary sacrificial handling layer 80 down to the barrier layer 60. The barrier layer 60 may prevent further chemical damage to the remainder of the wafer assembly as the temporary sacrificial handling layer 80 is removed. The chemical solution may also be selected to remove the temporary sacrificial handling layer 80 at a much faster rate than the barrier layer 60 and protective layer 120 such that the conductive metal layer 40, the dies 12, and their bonding pads 102 and circuitry remain intact after the temporary sacrificial handling layer 80 is removed. The result showing individual dies 12 can be seen in FIG. 12.

Figure 13:
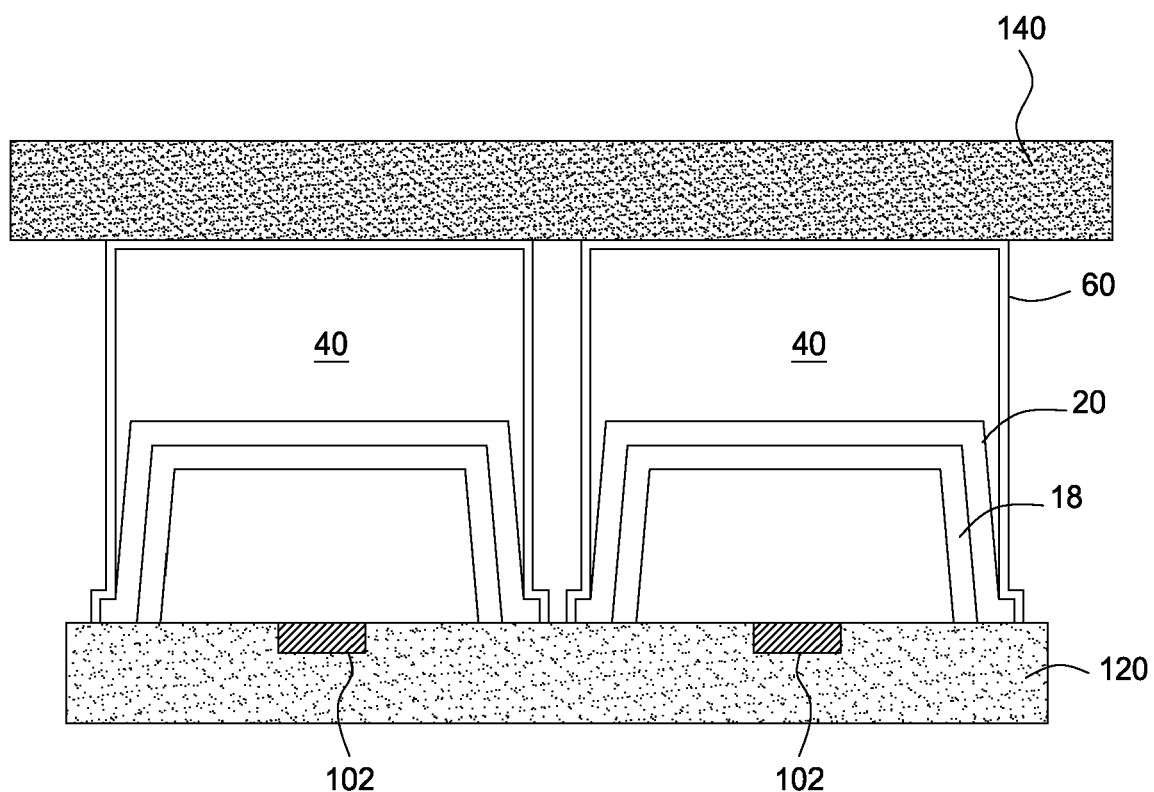
FIG. 13 illustrates adding an adhesive expandable material to the structure of FIG. 12 in accordance with an embodiment of the invention.
Figure 14:
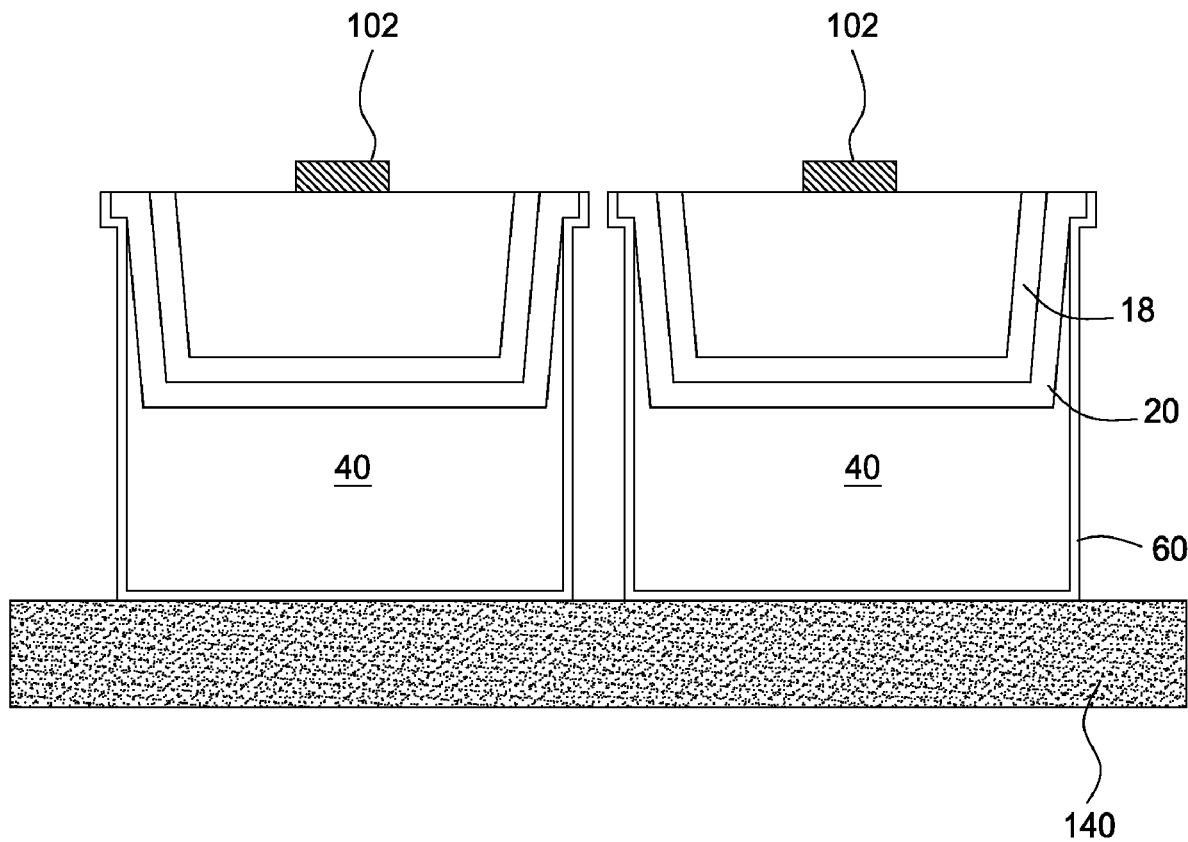
FIG. 14 illustrates flipping the structure of FIG. 13 over and removing the protective layer in accordance with an embodiment of the invention.
Figure 15:
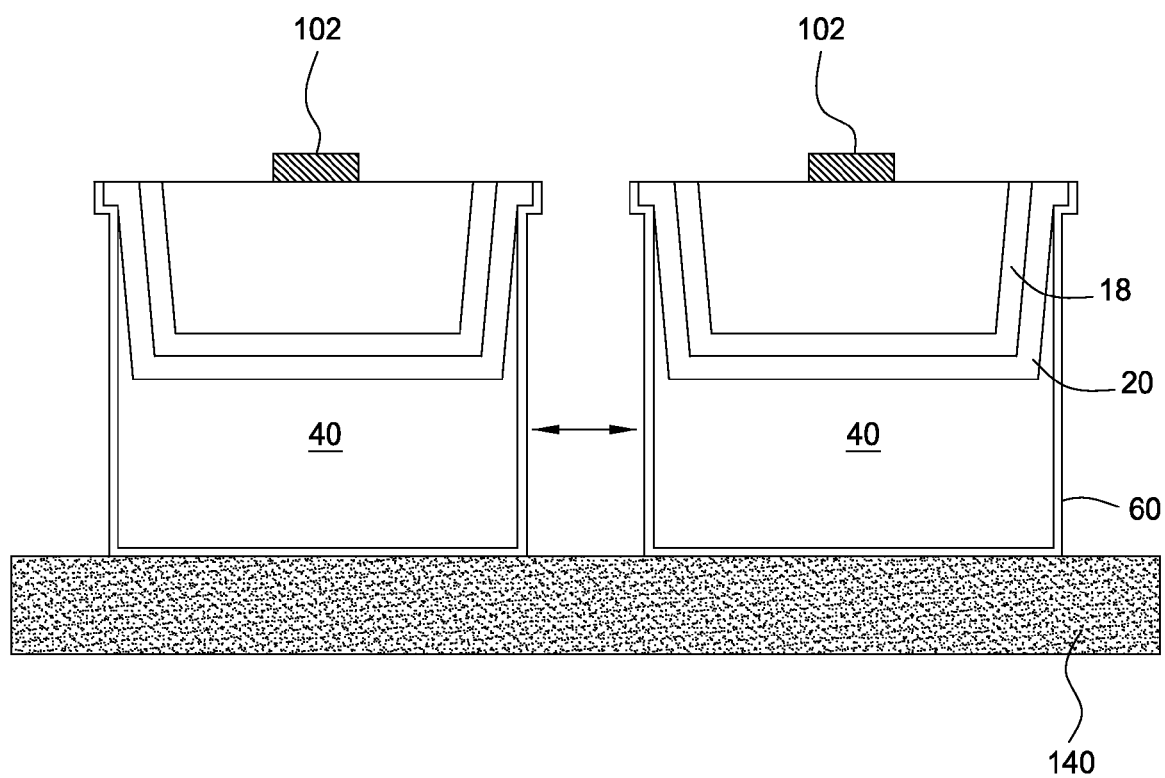
FIG. 15 illustrates expansion of the adhesive expandable material of FIG. 14 in accordance with an embodiment of the invention.

Referring now to FIG. 13, an adhesive expandable material 140 may be added to the surface of the barrier layer 60. This adhesive expandable material 140 is usually a type of tape, and may comprise metal tape or an ultraviolet-curable adhesive tape known as UV tape. Next, the protective layer 120 may be removed, the structure may be flipped over (FIG. 14), and the tape may be optionally expanded to further separate the semiconductor dies 12 to achieve a desired separation distance (FIG. 15).

An Exemplary Method of Separating VLED Dies

Now that one embodiment of the present invention has been described, a similar separation method as disclosed herein will be applied to a wafer having multiple vertical light-emitting diode (VLED) dies as a particular, but not limiting, application example.

Figure 16A:
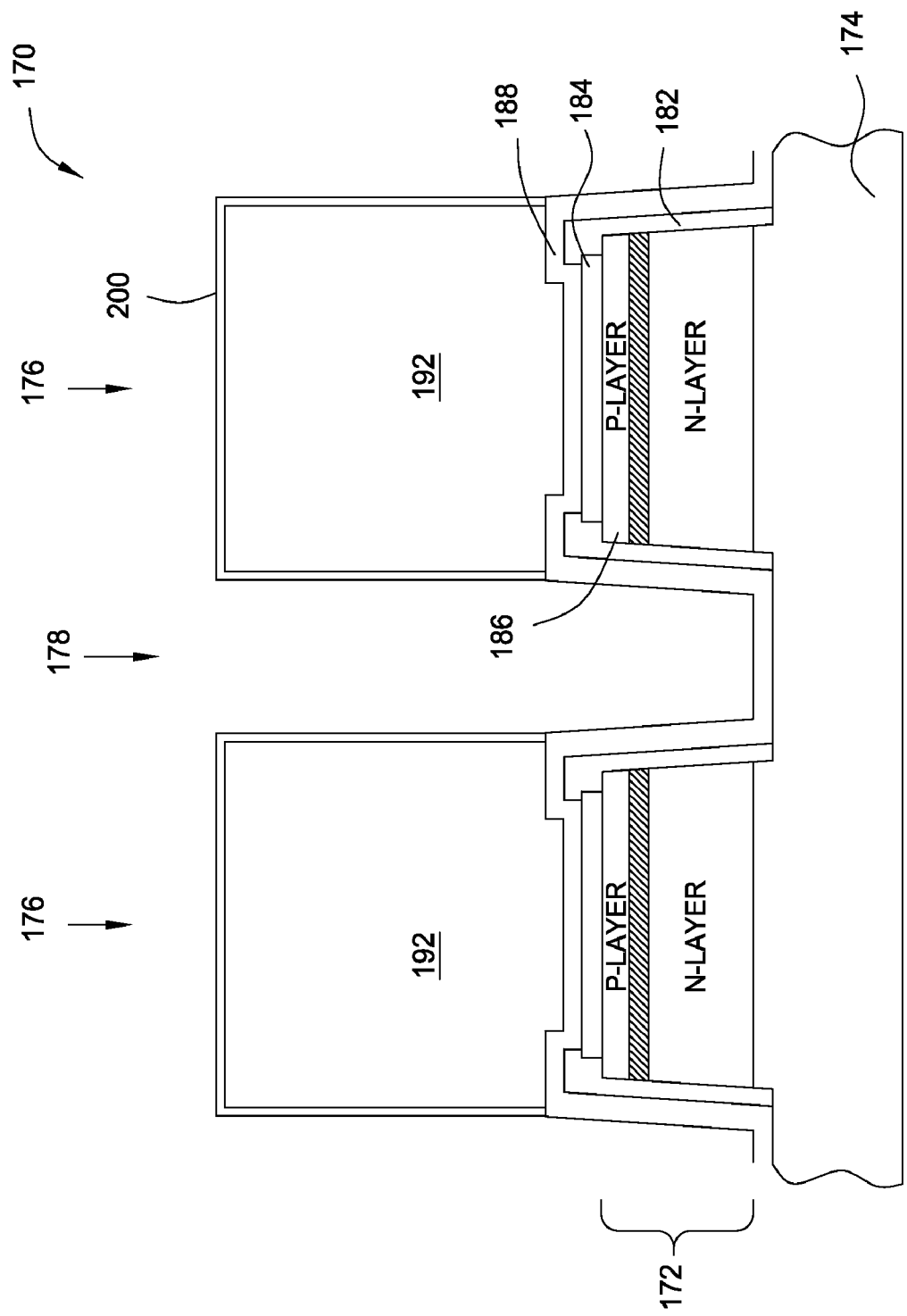
FIG. 16A illustrates a vertical light-emitting diode (VLED) structure comprising two LED stacks on a wafer wherein a stop EP area has been added in the streets of the VLED structure, a conductive metal layer was deposited above the LED stacks, the stop EP area was removed, and a barrier layer was added above the VLED structure in accordance with an embodiment of the invention.

Referring to FIG. 16A, a multilayered epitaxial structure 170 is provided depicting two vertical gallium nitride (GaN) p-n junctions (referred to as LED stacks 172) that have been grown on a substrate 174 and compose part of the VLED dies 176. The substrate 174 may be composed of sapphire. A street 178 may be disposed between the dies 176.

After passivation layers 182 may have been added to protect the dies 176 and contacts (not shown) have been formed to make connections to the mirror layer 184 (disposed above and coupled to the p-GaN layer 186), a seed metal layer 188 may be deposited using several techniques including physical vapor deposition, evaporation, plasma spray, chemical vapor deposition or electroless deposition as described above. The seed metal layer 188 may be composed of Cr/Au, Cr/Au/Ni/Au, Cr/Au/Ti/Ni/Au, Ti, Ti/Au, Ti/Ni/Au, Ni/Pd/Au, or Ni/Au. Additional metal layers may be formed above the seed metal layer 188 in an effort to further protect the underlying layers. In multilayered implementations, the individual metal layers may be composed of different metals, be formed using different techniques, and possess different thicknesses.

Figure 18A:
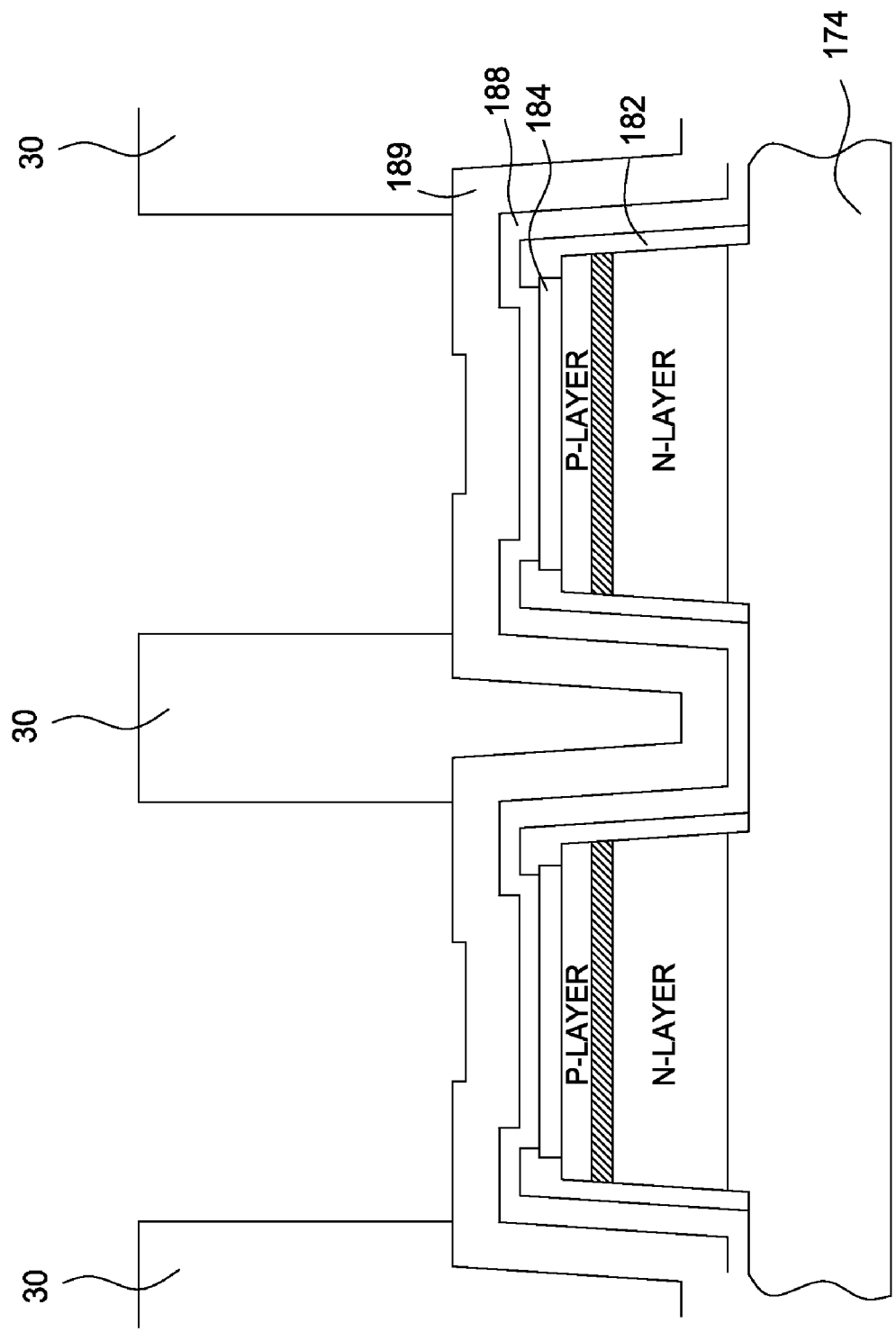
FIG. 18A illustrates a VLED structure comprising two LED stacks on a wafer wherein a handling layer together with a connected conductor was deposited above the LED stacks and a stop EP area has been added in the streets of the VLED structure in accordance with an embodiment of the invention.

For some embodiments, a conductive handling layer (or continuous conductive metal layer) 189 may be deposited above the seed metal layer 188, as shown in FIG. 18A. For other embodiments, the conductive handling layer 189 may replace the seed metal layer 189, functioning as a seed metal layer for additional metal layers to be deposited. One purpose of the handling layer 189 may be to provide a rigid support structure for the wafer assembly such that the wafer assembly may be handled during subsequent processing once the substrate 174 has been removed. The handling layer 189 may be deposited using electrochemical deposition, electroplating (EP), electroless chemical deposition, PVD, CVD, or evaporation. Typically, the handling layer 189 is formed as a continuous layer across the surface of the wafer assembly.

The handling layer 189 may comprise any electrically conductive material that is suitably hard for the desired thickness, such as Cr/Au (chromium-containing layer with a gold coating layer on top), Ni/Au (nickel-containing layer with a gold coating layer on top), Ti/Au (titanium-containing layer with a gold coating layer on top), Al/Ti (aluminum-containing layer with a titanium coating layer on top), Ag/Ti (silver-containing layer with a titanium coating layer on top), Ni/Pd/Au (nickel-containing layer with a palladium coating layer and a gold coating layer on top), Cr/Au/Ti/Ni/Au (chromium-containing layer with a gold coating layer, a titanium coating layer, a nickel coating layer, and another gold coating layer on top), Rh, Mo, Pd, Ru, Cu, Pd—Ru (layer containing palladium and ruthenium), Pt—Rh (layer containing palladium and rhodium), Ni—Co (layer containing nickel and cobalt), Cu—Co (layer containing copper and cobalt), Cu—Mo (layer containing copper and molybdenum), Cu/Ni—Co/Au (copper-containing layer coated with a layer containing nickel and cobalt and with a gold coating layer on top), Cu/Au (copper-containing layer with a gold coating layer on top), W/Au (tungsten-containing layer with a gold coating layer on top), TiW/Au (layer containing titanium and tungsten coated with a gold layer on top), Pt/Au (platinum-containing layer coated with a gold layer on top), Mo/Au (molybdenum-containing layer coated with a gold layer on top), Co/Au (cobalt-containing layer coated with a gold layer on top), Pd/Au (palladium-containing layer coated with a gold layer on top), Ag, Ag/Au (silver-containing layer coated with a gold layer on top), Au, Ni/Cu (nickel-containing layer coated with a copper layer on top), Cu/Ni—Co/Cu (copper-containing layer coated with a layer containing nickel and cobalt and with a copper coating layer on top), Cu/Ni—Co/Cu/Ni—Co (copper-containing layer coated with a layer containing nickel and cobalt, with a second copper-containing layer, and with a second layer containing nickel and cobalt on top), Cu/Rh/Cu (copper-containing layer coated with a rhodium-containing layer and with a copper-containing layer on top), Cu/Pd—Ru/Cu (copper-containing layer coated with a layer containing palladium and ruthenium and with a copper-containing layer on top), Ni/Cu—Mo (nickel-containing layer coated with a layer containing copper and molybdenum, or alloys thereof. The thickness of the handling layer 189 is typically greater than 1 µm. However, the particular thickness selected for any given application may depend on the hardness of the metal(s), metal alloy(s), or other materials used. For example, if a metal (alloy) with a hardness of 120 HV is used, the handling layer 189 may have a thickness of approximately 40 µm, while if a metal (alloy) with a hardness of 500 HV is used, the handling layer 189 may have a thickness of 20 µm. The hardness of the handling layer 189 is typically greater than 100 HV, and may, for some embodiments, lie within the range 100 to 1000 HV. For some embodiments, the thickness of the handling layer 189 may be reduced in the street 178 to aid in the process of separating the dies 176.

Once the desired number of metal layers has been created, a stop EP area (not shown), may be formed using a mask or other suitable techniques and may most likely be positioned only above the street 178 in an effort to block the growth of metal on the street 178. The stop EP area may be composed of a non-conductive material and may be photosensitive or non-photosensitive. Suitable material for the stop EP area may include a polymer, a polyimide, epoxy, a resist, thermoplastic, a parylene, a dry film resist, SU-8, NR7, silicone, ceramic, or any suitable carbon-containing organic material. The thickness of the stop EP area is typically greater than 1 µm.

Figure 18B:
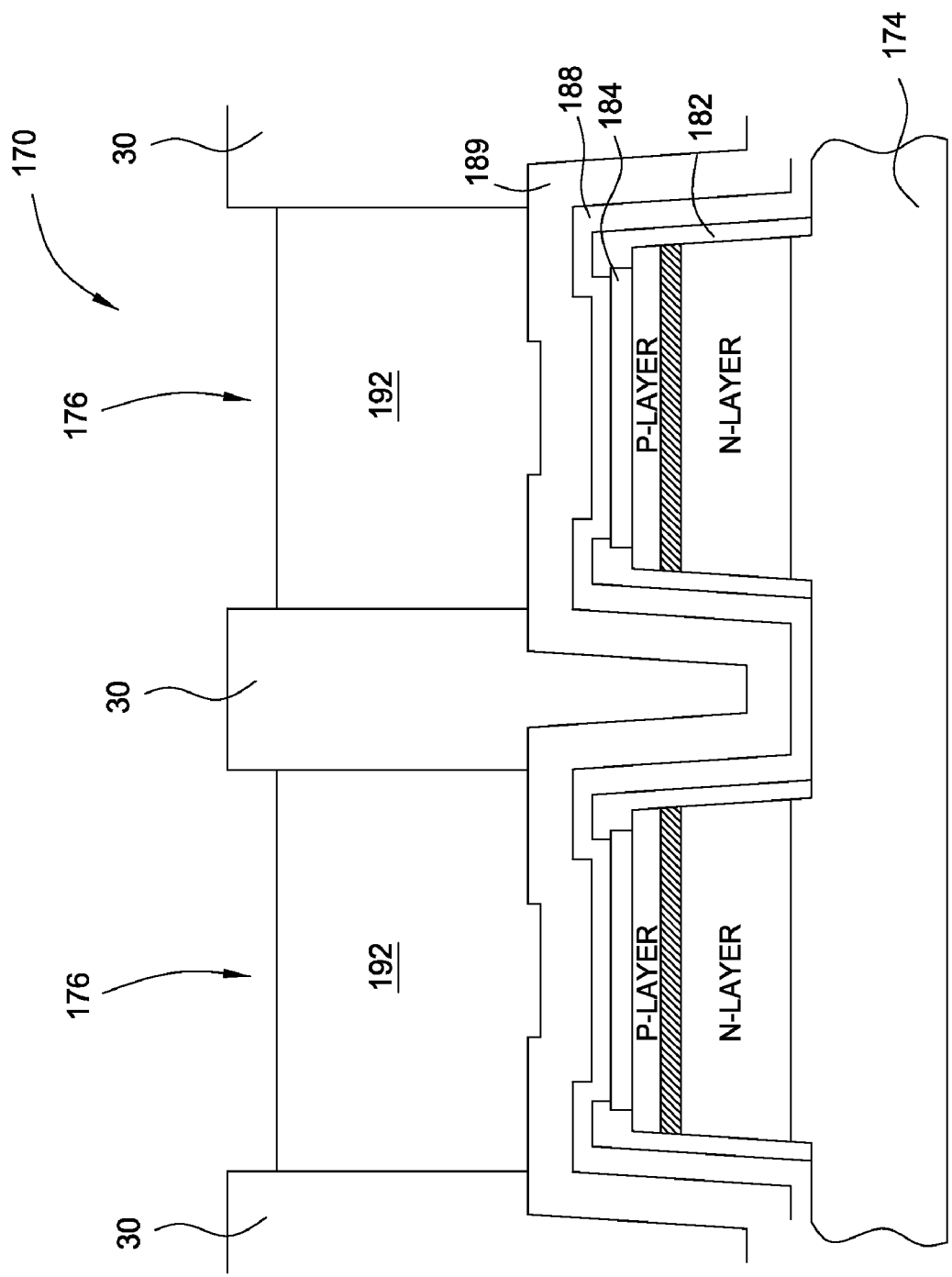
FIG. 18B illustrates depositing a conductive metal layer above the LED stacks of FIG. 18A in accordance with an embodiment of the invention.

Suitable deposition techniques, such as electroplating (EP), electroless plating, PVD, CVD, or evaporation may then be used to grow a conductive metal layer 192 above the semiconductor structure 170 as depicted in FIGS. 16A and 18B. Serving as a metal substrate for the VLED dies 176, the conductive metal layer 192 may comprise a single layer or multiple layers, consisting of single metals or metal alloys in either case. The thickness of the conductive metal layer 192 is typically greater than 1 µm, but should be controlled so that the conductive metal layer on top of one die 176 is not connected to that above another die 176. The preferred thickness of the conductive metal layer 192 is typically between 5 µm and 1000 µm.

Figure 18C:
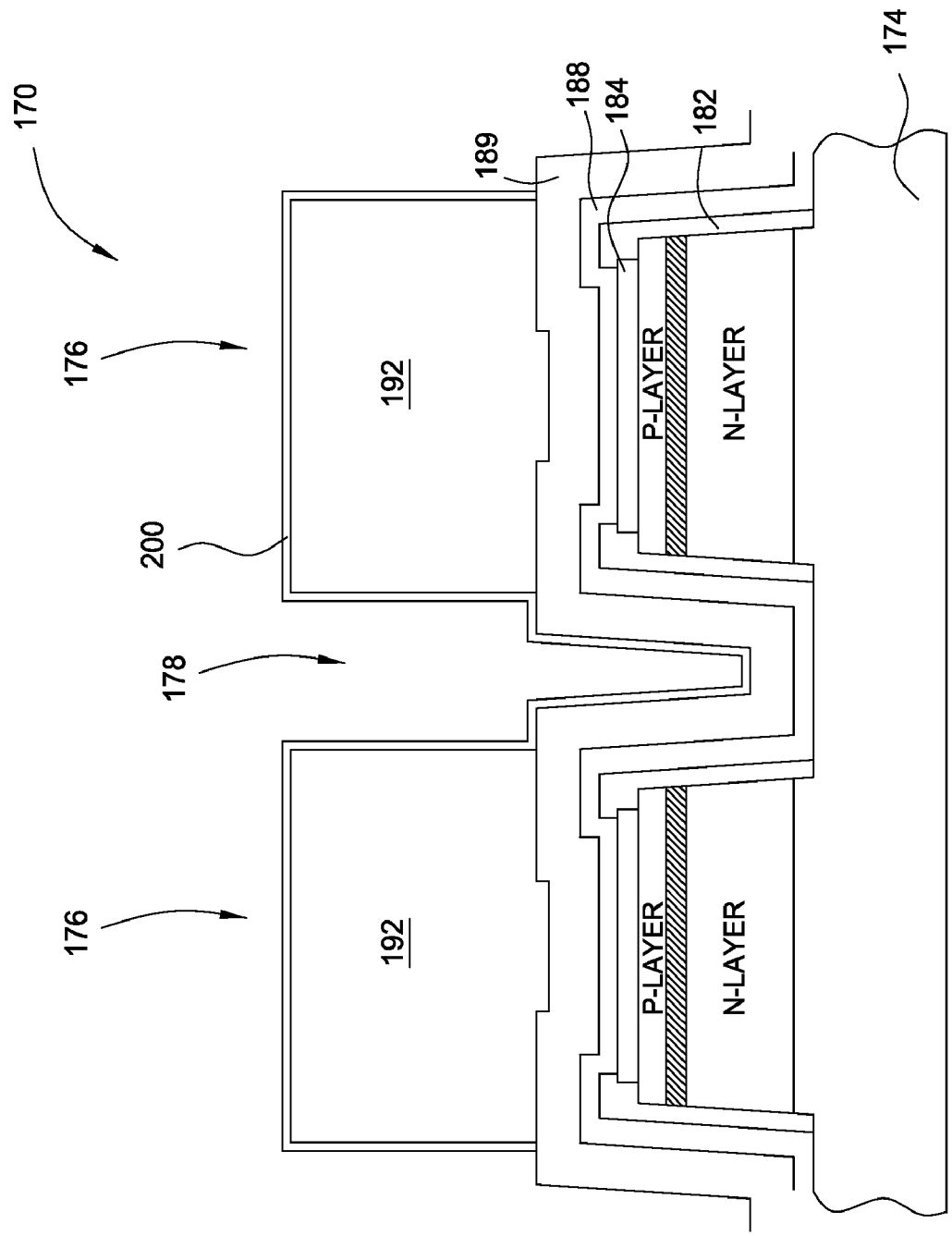
FIG. 18C illustrates removing the stop EP area and forming a barrier layer above the structure in FIG. 18B in accordance with an embodiment of the invention.

Referring to FIGS. 16A and 18C, the stop EP area may have been eradicated using, for example, wet etching. A barrier layer 200, composed of a single layer or multiple formed layers, may then be formed through deposition (e.g., PVD, CVD, e-beam electroplating, or electroless plating), spraying, or coating to cover the total area of the conductive metal layer 192 and the street 178. The barrier layer 200 may comprise any suitable material, such as Cr/Au, Ni/Au, Ti/Au, Al/Ti, Ag/Ti, Cr/Au/Ti/N i/Au, Ni/Pd/Au, or Ti/N i/Au.

Figure 16B:
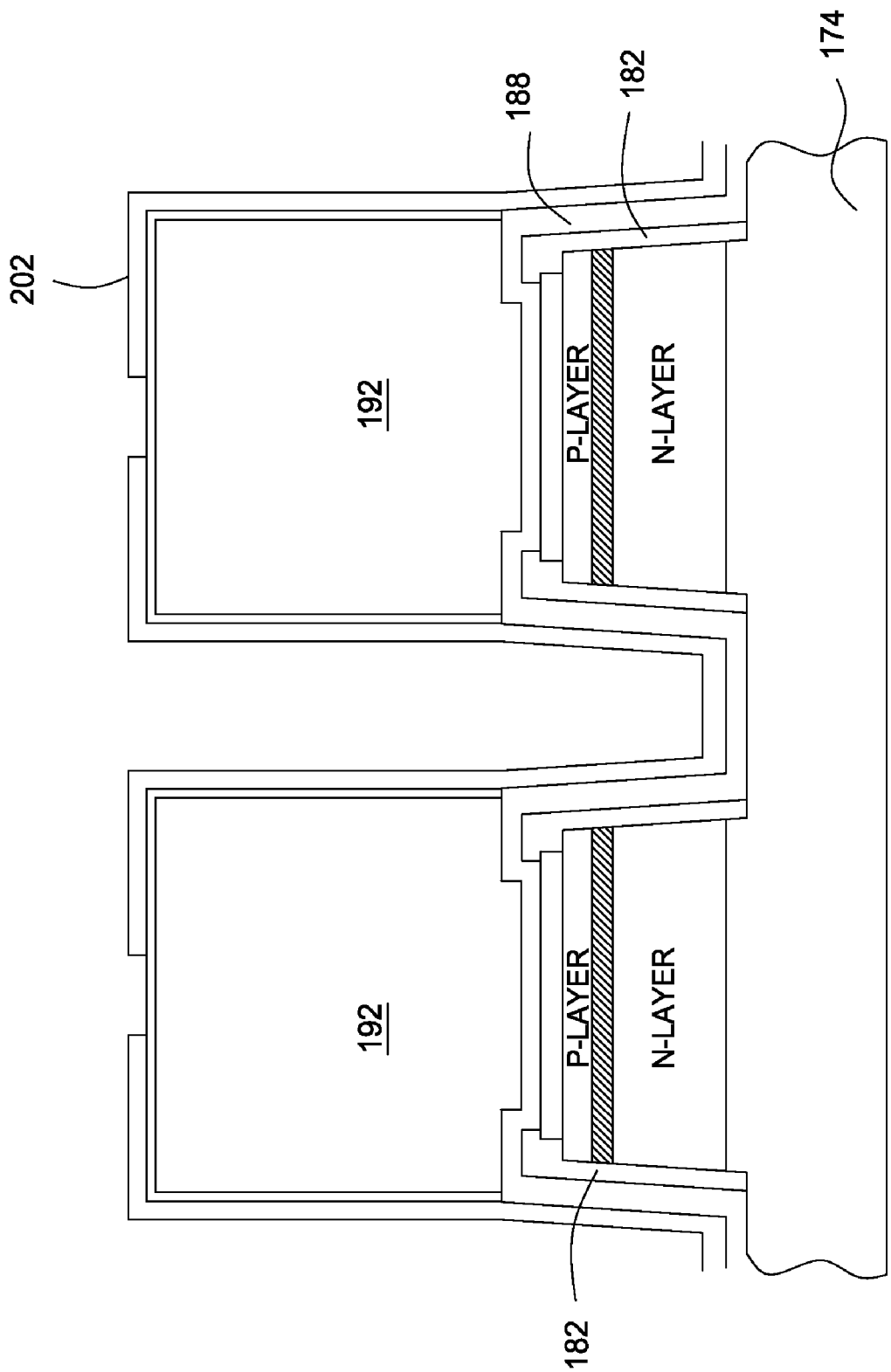
FIGS. 16B-C illustrate forming an additional barrier layer above the barrier layer in FIG. 16A in accordance with embodiments of the invention.
Figure 16C:
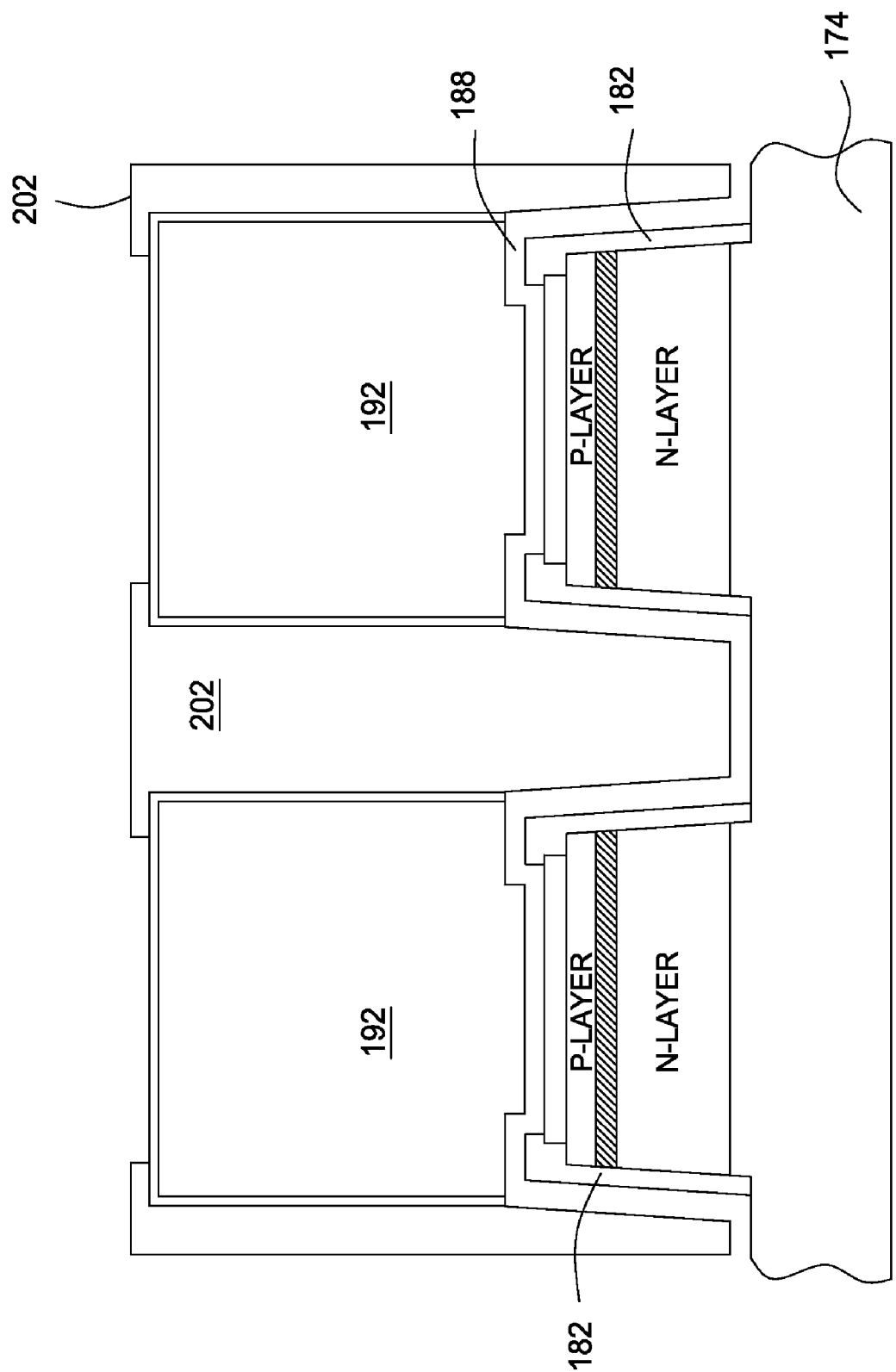

For some embodiments, an additional barrier layer 202 may be formed and patterned above the barrier layer 200 as illustrated in FIGS. 16B and 16C. Referring to FIG. 16C, the additional barrier layer 202 may completely fill in the volume above the street 178 for some embodiments. The additional barrier layer 202 may comprise a non-conductive material and may be photosensitive or non-photosensitive. Suitable material for the additional barrier layer 202 may include a polymer, a polyimide, epoxy, a resist, thermoplastic, a parylene, a dry film resist, SU-8, NR7, silicone, or ceramic.

Once the barrier layer 200 has been generated, portion of the metals on the street 178 may be removed. The removal of portions of the barrier layer 200, any intermediate metal layers, and the seed metal layer 188 on the street 178 may be accomplished by any suitable technique, such as dry etching (ICP/RIE), laser cutting, saw cutting, wet etching, or a water jet. In some cases, the removal process may also fully or partially cut through the material on the street 178. For some embodiments, the removal process may cut into the substrate 174.

Figure 17:
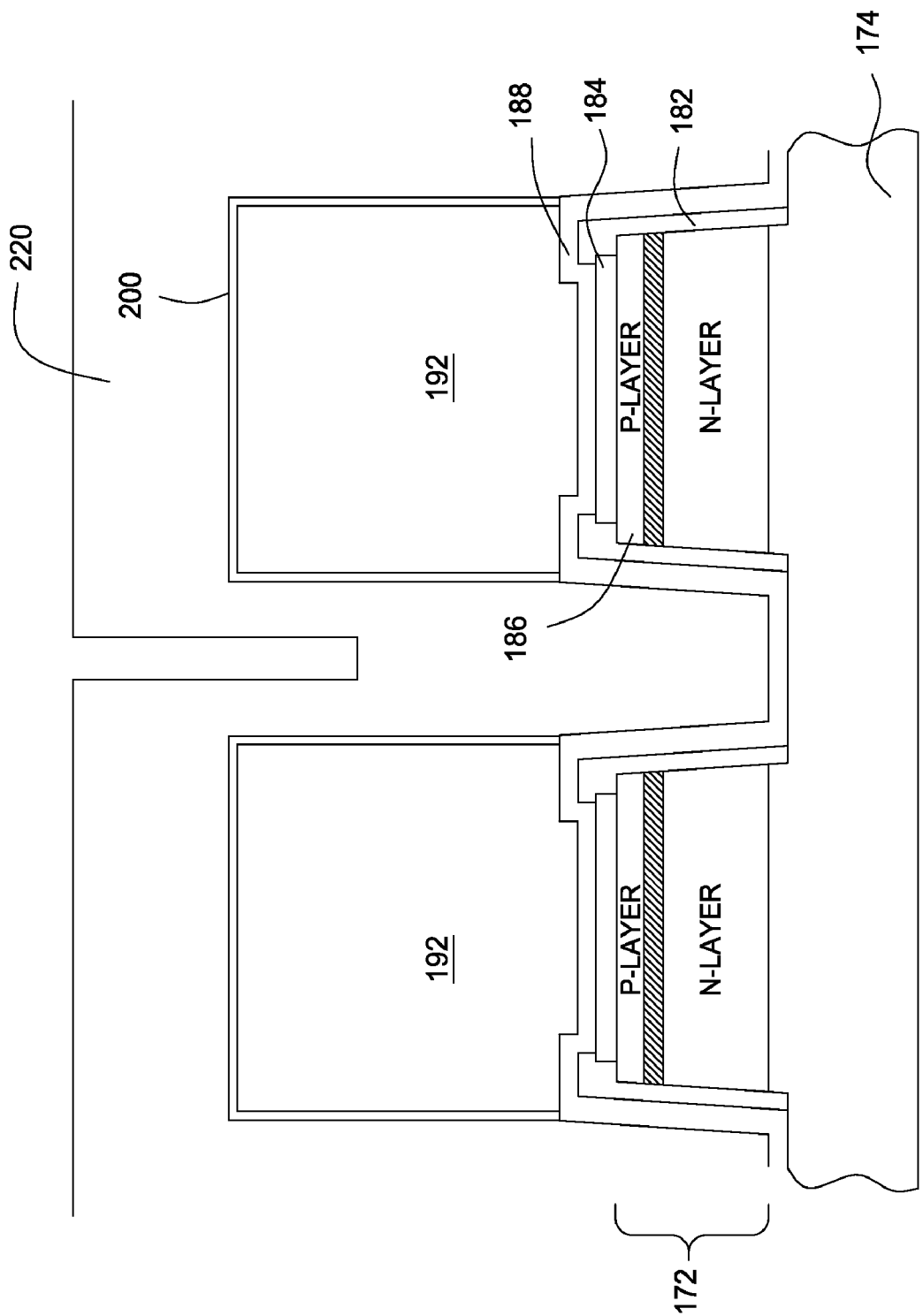
FIG. 17 illustrates adding a sacrificial metal element above the VLED structure of FIG. 16A in accordance with an embodiment of the invention.

Referring to FIG. 17, a sacrificial metal element 220 for handling may be grown, for example, via PVD, CVD, evaporation, plasma spray, electroplating, or electroless plating. The sacrificial metal element 220 may comprise a single layer or multiple layers, consisting of single metals or metal alloys in either case. Possibilities include Cu, Ni, Mo, W, Co, Pd, Pt, Ag, doped polysilicon Ni—Co, Ag, Au, Cu—Co, Cu—Mo, Ni/Cu, Cu/Ni—Co/Cu, Cu/Ni—Co/Cu/Ni—Co, and Ni/Cu—Mo or their alloys. The thickness of the metal layers composing the sacrificial metal element 220 is typically between 5 μm and 1000 μm.

Now that a second structure (the sacrificial metal element 220) may have been added to hold the wafer assembly together during handling and die cutting, the substrate 174 may be removed by any suitable means, such as single pulse laser irradiation, a selected photo-enhanced chemical etching of the interfacial layer between the substrate 174 and GaN, plasma etching, grinding, polishing, or wet etching.

Once the substrate 174 has been removed, the bottom surface of the multilayered epitaxial structure should be exposed and may be operated on. Any desired n-type bonding pads and/or circuit pattern on the remaining n-GaN may then be fabricated on the underside of the wafer assembly. With the sacrificial metal element 220 electrically coupled to all of the p-GaN areas on the wafer, LED devices having n-type bonding pads may then be probed using the sacrificial metal element 220 as a common test point.

The bottom surface of the wafer assembly may be passivated by a protective layer as described above, for example, in an effort to hold the individual VLED dies 176 together. Therefore, the sacrificial metal element 220 may no longer be necessary and may be removed. An adhesive expandable material, such as tape, may be added to the surface of the barrier layer 200 as described above, and then the protective layer may be removed. The adhesive expandable material may be optionally expanded to further separate the VLED dies 176 in an effort to achieve a desired separation distance as described above.

While the foregoing is directed to embodiments of the present invention, other and further embodiments of the invention may be devised without departing from the basic scope thereof, and the scope thereof is determined by the claims that follow.

The invention claimed is:

1. A method of fabricating a plurality of semiconductor dies, comprising:
forming one or more semiconductor layers on a substrate;
defining the plurality of semiconductor dies separated by streets in the semiconductor layers;
depositing a first handling layer above the semiconductor layers;
depositing a plurality of metal layers above the first handling layer;
removing at least a portion of the metal layers disposed in the streets;
removing the substrate to expose a surface of the semiconductor layers; and
applying an adhesive above the metal layers.

2. The method of claim 1, wherein the first handling layer comprises at least one of Cr/Au, Ni/Au, Ti/Au, Al/Ti, Ag/Ti, Ni/Pd/Au, Cr/Au/Ti/Ni/Au, Rh, Mo, Pd, Ru, Cu, Pd—Ru, Pt—Rh, Ni—Co, Cu—Co, Cu—Mo, Cu/Ni—Co/Au, Cu/Au, W/Au, TiW/Au, Pt/Au, Mo/Au, Co/Au, Pd/Au, Ag, Ag/Au, Au, Ni/Cu, Cu/Ni—Co/Cu, Cu/Ni—Co/Cu/Ni—Co, Cu/Rh/Cu, Cu/Pd—Ru/Cu, Ni/Cu—Mo, and alloys thereof.

3. The method of claim 1, wherein depositing the first handling layer comprises at least one of electrochemical deposition, electroplating (EP), electroless chemical deposition, physical vapor deposition (PVD), chemical vapor deposition (CVD), and evaporation.

4. The method of claim 1, wherein the thickness of the first handling layer is dependent on the hardness of a material used in the first handling layer.

5. The method of claim 4, wherein the hardness of the first handling layer is in a range of 100 to 1000 HV and HV is the Vickers Hardness.

6. The method of claim 1, wherein the first handling layer provides a rigid support structure for the plurality of semiconductor dies during subsequent processing in the method of fabricating the dies.

7. The method of claim 1, further comprising forming stop electroplating (EP) areas in the streets before depositing the metal layers.

8. The method of claim 7, wherein the stop EP areas comprise at least one of a polymer, a polyimide, epoxy, a resist, thermoplastic, a parylene, a dry film resist, SU-8, NR7, silicone, ceramic, or a carbon-containing organic material.

9. The method of claim 7, further comprising removing the stop EP areas after depositing the plurality of metal layers.

10. The method of claim 9, wherein removing the stop EP areas comprises wet etching.

11. The method of claim 1, wherein the adhesive comprises ultraviolet-curable (UV) tape or metal tape.

12. The method of claim 1, further comprising expanding the adhesive to separate the plurality of semiconductor dies to a desired separation distance.

13. The method of claim 1, further comprising adding a second handling layer to the exposed surface of the semiconductor layers.

14. The method of claim 13, wherein the second handling layer comprises at least one of Cr/Au, Ni/Au, Ti/Au, Al/Ti/Ag/Ti, Cr/Au/Ti/Ni/Au, Ni/Pd/Au, Ti/Ni/Au, Si, GaAs, GaP, InP, a polymer, a polyimide, epoxy, a parylene, a resist, a dry film resist, thermoplastic, silicone, ceramic, $SiO_2$, $Si_3N_4$, ZnO, $Ta_2O_5$, $TiO_2$, HfO, MgO, and combinations thereof.

15. The method of claim 13, further comprising attaching a third handling layer to the second handling layer to enhance handling.

16. The method of claim 15, wherein the third handling layer comprises at least one of sapphire, Si, Mo, Cu, and Al.

17. The method of claim 1, wherein the substrate comprises sapphire, $SiO_2$, GaAs, InP, InGaAsP, Si, ZnO, ZrN, or AlN.

18. The method of claim 1, wherein depositing the plurality of metal layers comprises at least one of physical vapor deposition (PVD), evaporation, plasma spray, chemical vapor deposition (CVD), and electroless deposition.

19. The method of claim 1, wherein removing at least the portion of the metal layers disposed in the streets comprises at least one of dry etching (inductively coupled plasma/reactive ion etching (ICP/RIE)), laser cutting, saw cutting, wet etching, and applying a water jet.

20. The method of claim 1, further comprising depositing a passivation layer above the semiconductor layers before depositing the first handling layer.

21. The method of claim 1, further comprising adding bonding pads or circuit patterns to the exposed surface of the semiconductor layers.

22. The method of claim 1, wherein the plurality of semiconductor dies is a plurality of vertical light-emitting diode (VLED) dies.

23. The method of claim 1, further comprising:
depositing a barrier layer above the plurality of metal layers; and
removing at least a portion of the barrier layer disposed in the streets when or before removing the at least the portion of the metal layers, wherein applying the adhesive comprises applying the adhesive to the barrier layer.

24. The method of claim 23, wherein the barrier layer is a conductor comprising at least one of Cr/Au, Ni/Au, Ti/Au, Al/Ti, Ag/Ti, Cr/Au/Ti/Ni/Au, Ni/Pd/Au, and Ti/Ni/Au.

25. The method of claim 23, wherein the barrier layer is a semiconductor comprising at least one of Si, GaAs, GaP, and InP.

26. The method of claim 23, wherein the barrier layer is an insulator comprising at least one of a polymer, a polyimide, epoxy, a parylene, a resist, a dry film resist, thermoplastic, silicone, ceramic, $SiO_2$, $Si_3N_4$, ZnO, $Ta_2O_5$, $TiO_2$, HfO, and MgO.

27. A method of fabricating a plurality of semiconductor dies, comprising:
forming one or more semiconductor layers on a substrate;
defining the plurality of semiconductor dies separated by streets in the semiconductor layers;
depositing a first handling layer above the semiconductor layers;
forming stop electroplating (EP) areas in the streets;
depositing a plurality of metal layers above the first handling layer, wherein the stop EP areas discourage metal deposition in at least portions of the streets;
removing the stop EP areas;
removing at least a portion of the first handling layer disposed in the streets;
removing the substrate to expose a surface of the semiconductor layers; and
applying an adhesive above the metal layers.

28. The method of claim 27, further comprising depositing one or more connected conductor layers above the semiconductor layers, wherein depositing the first handling layer comprises depositing the first handling layer above the connected conductor layers.

29. The method of claim 28, wherein depositing the connected conductor layers comprises at least one of physical vapor deposition (PVD), evaporation, plasma spray, chemical vapor deposition (CVD), electrodeposition, and electroless deposition.

30. The method of claim 27, wherein the first handling layer comprises at least one of Cr/Au, Ni/Au, Ti/Au, Al/Ti, Ag/Ti, Ni/Pd/Au, Cr/Au/Ti/Ni/Au, Rh, Mo, Pd, Ru, Cu, Pd—Ru, Pt—Rh, Ni—Co, Cu—Co, Cu—Mo, Cu/Ni—Co/Au, Cu/Au, W/Au, TiW/Au, Mo/Au, Co/Au, Pd/Au, Pt/Au, Ag, Ag/Au, Au, Ni/Cu, Cu/Ni—Co/Cu, Cu/Ni—Co/Cu/Ni—Co, Cu/Rh/Cu, Cu/Pd—Ru/Cu, Ni/Cu—Mo, and alloys thereof.

31. The method of claim 27, wherein depositing the first handling layer comprises at least one of electrochemical deposition, electroplating (EP), electroless chemical deposition, physical vapor deposition (PVD), chemical vapor deposition (CVD), and evaporation.

32. The method of claim 27, wherein the thickness of the first handling layer is dependent on the hardness of a material used in the first handling layer.

33. The method of claim 32, wherein the hardness of the first handling layer is in a range of 100 to 1000 HV and HV is the Vickers Hardness.

34. The method of claim 27, wherein the first handling layer provides a rigid support structure for the plurality of semiconductor dies during subsequent processing in the method of fabricating the dies.

35. The method of claim 27, further comprising adding a second handling layer to the exposed surface of the semiconductor layers.

36. The method of claim 35, wherein the second handling layer comprises at least one of Cr/Au, Ni/Au, Ti/Au, Al/Ti/Ag/Ti, Cr/Au/Ti/Ni/Au, Ni/Pd/Au, Ti/Ni/Au, Si, GaAs, GaP, InP, a polymer, a polyimide, epoxy, a parylene, a resist, a dry film resist, thermoplastic, silicone, ceramic, $SiO_2$, $Si_3N_4$, ZnO, $Ta_2O_5$, $TiO_2$, HfO, MgO, and combinations thereof.

37. A method of fabricating a plurality of semiconductor dies, comprising:
forming one or more semiconductor layers on a substrate;
defining the plurality of semiconductor dies separated by streets in the semiconductor layers;
depositing a handling layer above the semiconductor layers;
forming stop electroplating (EP) areas in the streets;
depositing a plurality of metal layers above the handling layer, wherein the stop EP areas discourage metal deposition in at least portions of the streets; and
removing the stop EP areas.

38. The method of claim 37, further comprising depositing one or more connected conductor layers above the semiconductor layers, wherein depositing the handling layer comprises depositing the handling layer above the connected conductor layers.

39. The method of claim 38, wherein depositing the connected conductor layers comprises at least one of physical vapor deposition (PVD), evaporation, plasma spray, chemical vapor deposition (CVD), electrodeposition, and electroless deposition.

40. The method of claim 37, wherein the handling layer comprises at least one of Cr/Au, Ni/Au, Ti/Au, Al/Ti, Ag/Ti, Ni/Pd/Au, Cr/Au/Ti/Ni/Au, Rh, Mo, Pd, Ru, Cu, Pd—Ru, Pt—Rh, Ni—Co, Cu—Co, Cu—Mo, Cu/Ni—Co/Au, Cu/Au, W/Au, TiW/Au, Pt/Au, Mo/Au, Co/Au, Pd/Au, Ag, Ag/Au, Au, Ni/Cu, Cu/Ni—Co/Cu, Cu/Ni—Co/Cu/Ni—Co, Cu/Rh/Cu, Cu/Pd—Ru/Cu, Ni/Cu—Mo, and alloys thereof.

41. The method of claim 37, wherein depositing the handling layer comprises at least one of electrochemical deposition, electroplating (EP), electroless chemical deposition, physical vapor deposition (PVD), chemical vapor deposition (CVD), and evaporation.

42. The method of claim 37, wherein the thickness of the handling layer is dependent on the hardness of a material used in the handling layer.

43. The method of claim 42, wherein the hardness of the handling layer is in a range of 100 to 1000 HV and HV is the Vickers Hardness.

44. The method of claim 37, wherein the handling layer provides a rigid support structure for the plurality of semiconductor dies during subsequent processing in the method of fabricating the dies.

45. The method of claim 37, further comprising removing the substrate to expose a surface of the semiconductor layers.

46. The method of claim 45, further comprising adding bonding pads or circuit patterns to the exposed surface of the semiconductor layers.

47. The method of claim 37, wherein the stop EP areas comprise at least one of a polymer, a polyimide, epoxy, a resist, thermoplastic, a parylene, a dry film resist, SU-8, NR7, silicone, ceramic, and a carbon-containing organic material.

48. The method of claim 37, further comprising depositing a barrier layer to protect the handling layer and the plurality of metal layers.

49. The method of claim 48, wherein the barrier layer is a conductor comprising at least one of Cr/Au, Ni/Au, Ti/Au, Al/Ti, Ag/Ti, Cr/Au/Ti/Ni/Au, Ni/Pd/Au, and Ti/Ni/Au.

50. The method of claim 48, wherein the barrier layer is a semiconductor comprising at least one of Si, GaAs, GaP, and InP.

51. The method of claim 48, wherein the barrier layer is an insulator comprising at least one of a polymer, a polyimide, epoxy, a parylene, a resist, a dry film resist, thermoplastic, silicone, ceramic, $SiO_2$, $Si_3N_4$, ZnO, $Ta_2O_5$, $TiO_2$, HfO, and MgO.

* * * * *